(12) United States Patent
Zagoskin et al.

(10) Patent No.: US 6,979,836 B2
(45) Date of Patent: Dec. 27, 2005

(54) SUPERCONDUCTING LOW INDUCTANCE QUBIT

(75) Inventors: Alexandre M. Zagoskin, Vancouver (CA); Alexander Ya. Tzalenchuk, Middlesex (GB); Jeremy P. Hilton, Vancouver (CA)

(73) Assignee: D-Wave Systems, Inc., Vancouver (CA)

( * ) Notice: Subject to any disclaimer, the term of this patent is extended or adjusted under 35 U.S.C. 154(b) by 373 days.

(21) Appl. No.: 10/232,136

(22) Filed: Aug. 29, 2002

(65) Prior Publication Data

US 2003/0071258 A1 Apr. 17, 2003

Related U.S. Application Data

(60) Provisional application No. 60/316,134, filed on Aug. 29, 2001.

(51) Int. Cl.[7] .............................................. H01L 29/06
(52) U.S. Cl. ............................ 257/31; 257/33; 257/36; 257/39
(58) Field of Search ...................... 257/31–39; 505/190; 365/160, 161, 162

(56) References Cited

U.S. PATENT DOCUMENTS

| | | | | |
|---|---|---|---|---|
| 4,371,796 A | * | 2/1983 | Takada ........................... | 326/6 |
| 5,157,466 A | * | 10/1992 | Char et al. ..................... | 257/33 |
| 5,323,344 A | * | 6/1994 | Katayama et al. ........... | 365/162 |
| 5,917,322 A | | 6/1999 | Gershenfeld et al. ........ | 324/307 |
| 6,058,127 A | | 5/2000 | Joannopoulos et al. | |
| 6,389,197 B1 | | 5/2002 | Iltchenko et al. | |
| 6,459,097 B1 | | 10/2002 | Zagoskin ...................... | 257/31 |
| 6,495,854 B1 | | 12/2002 | Newns et al. .................. | 257/31 |
| 6,504,172 B2 | | 1/2003 | Zagoskin et al. ............. | 257/14 |
| 6,563,311 B2 | | 5/2003 | Zagoskin ...................... | 324/248 |
| 6,627,916 B2 | | 9/2003 | Amin et al. ................... | 257/31 |
| 6,784,451 B2 | | 8/2004 | Amin et al. ................... | 257/34 |
| 6,803,599 B2 | | 10/2004 | Amin et al. ................... | 257/31 |
| 2002/0117656 A1 | | 8/2002 | Amin et al. ................... | 257/9 |
| 2003/0027724 A1 | | 2/2003 | Rose et al. ................... | 505/210 |
| 2003/0107033 A1 | | 6/2003 | Tzalenchuk et al. .......... | 257/31 |

OTHER PUBLICATIONS

DiVincenzo, 2000, "The physical implementation of quantum computation," *arXiv:quant-ph/0002077*.

Frateschi et al., 1995, "Polarization of lasing emission in microdisk laser diodes," *App. Phys. Lett.* 66:1859–1861.

Hecht, 1998, "Optics–3rd ed.," *Addison Wesley Longman, Inc.*, 362–366.

Iichenko et al., 2001, "Microtorus: a high–finesse microcavity with whispering–gallery modes," *Optics Letters* 26:256–258.

(Continued)

*Primary Examiner*—Sara Crane
(74) *Attorney, Agent, or Firm*—Jones Day; Brett Lovejoy

(57) ABSTRACT

A superconducting structure that can operate, for example, as a qubit or a superconducting switch is presented. The structure includes a loop formed from two parts. A first part includes two superconducting materials separated by a junction. The junction can, for example, be a 45° grain boundary junction. The second part can couple the two superconducting materials across the junction. The second part includes a superconducting material coupled to each of the two superconducting materials of the first part through c-axis junctions. Further embodiments of the invention can be as a coherent unconventional superconducting switch, or a variable phase shift unconventional superconductor junction device.

72 Claims, 12 Drawing Sheets

OTHER PUBLICATIONS

Ilchenko et al., 1999, "Pigtailing the high–Q microsphere cavity: a simple fiber coupler for optical whispering–gallery modes," *Optics Letters* 24:723–725.

Smirnov et al., 2002, "Polarization switching in optical microsphere resonator," *Applied Physics Letters* 80:3503–3505.

U.S. Appl. No. 09/452,749, Zagoskin, filed Dec. 1, 1999.

U.S. Appl. No. 60/316,164, Zagoskin, filed Aug. 29, 2001.

Averin, D.V., 2000, "Quantum Computing and Quantum Measurements with Mesoscopic Josephson Junctions," *Fortschritte der Physik* 48, pp. 1055—1074. Also published in Braunstein, S.L., and H.–K. Lo (eds.), 2000, *Scalable Quantum Computers*, Wiley–VCH, Berlin, ISBN 3–527–40321–3.

Barenco, A., C.H. Bennett, R. Cleve, D.P. DiVincenzo, N. Margolus, P. Shor, T. Sleator, J. Smolin, and H. Weinfurter, 1995, "Elementary gates for quantum computation, "*Phys. Rev.* A 52, pp. 3457–3467.

Blatter, G., V.B. Geshkenbein, and L. Ioffe, 2001, "Design aspects of superconducting–phase quantum bits, "*Phys. Rev.* B 63, 174511.

DiVincenzo, D. P., 2000, "The Physical Implementation of Quantum Computation," *Fortschritte der Physik* 48, pp. 771–783. Also published as DiVincenzo, D. P., 2000, ArXiv.org preprint server: quant–ph/0002077, and in Braunstein, S. L., and H.–K. Lo (eds.), 2000, *Scalable Quantum Computers*, Wiley–VCH, Berlin, ISBN 3–527–40321–3.

Hilgenkamp, H., and J. Mannhart, 2002, "Grain Boundaries in High–$T_c$ Superconductors," *Rev. Mod. Phys.* 74, pp. 485–544.

Il'ichev, E., M. Grajcar, R. Hlubina, R. P. J. IJsselsteijn, H. E. Hoenig, H.–G. Meyer, A. Golubov, M. H. S. Amin, A. M. Zagoskin, A. N. Omelyanchouk, and M. Yu. Kupriyanov, 2001, "Degenerate Ground State in a Mesoscopic $YBa_2Cu_3O_{7-X}$ Grain Boundary Josephson Junction," *Phys. Rev. Lett.* 86, pp. 5369–5372.

Il'ichev, E., V. Zakosarenko, R. IJsselsteijn, H. Hoenig, V. Schultze, H. Meyer, M. Grajcar, and R. Hlubina, 1998, "Anomalous Periodicity of the Current–Phase Relationship of Grain–Boundary Josephson Junctions in High–$T_c$ Superconductors", ArXiv.org. preprint server: cond–mat/9811017.

Ioffe, L.B., V.B. Geshkenbein, M.V. Feigel'man, A.L. Fauchère, and G. Blatter, 1999, "Environmentally decoupled sds–wave Josephson junctions for quantum computing," *Nature* 398, pp. 679–681.

Joyez, P., et al., 1994, "Observation of Parity–Induced Suppression of Josephson Tunneling in the Superconducting Single Electron Transistor,"*Phys. Rev. Lett.* 72, pp. 2458–2461.

Komissinki, P., E. Il'chev, G. Ovsyannikov, S. Kovtonyuk, M. Grajcar, Z. Ivanov, Y. Tanaka, N. Yoshida, and S. Kashiwaya, 2000, "Superconducting current–phase relation in $Nb/Au/(001)YBa_2Cu_3O_x$ heterojunctions", ArXiv.org preprint server: cond–mat/0008077 v2.

Koelle, D., R. Kleiner, F. Ludwig, E. Dantsker, and J. Clarke, 1999, "High–Transition–temperature superconducting quantum interference devices," *Rev. Mod. Phys.* 71, pp. 631–686.

Likharev, K.K., 1979, "Superconducting Weak Links,"*Rev. Mod. Phys.* 51, pp. 101–119, 122–131, 146–159.

Larsson, P., B. Nilsson, and Z. G. Ivanov, 2000, "Fabrication and transport measurement of $YBa_2Cu_3O_{7-X}$ nanostructures," *J. Vac. Sci. Technol.* B 18, 25–31.

Larsson, P., A. Ya, Tzalenchuk, and Z. G. Ivanov, 2001, "Transport properties of submicron $YBa_2Cu_3O_{7-\delta}$ step–edge Josephson junctions, " *J. Appl. Phys.* 90, 3450.

Lombardi, F., A. Ya. Tzalenchuk, S.E. Kubatkin, F. Tafuri, Z.G. Ivanov, P. Delsing, and T. Claeson, 2002, "Tunnel barriers for an all–high–$T_c$ single electron tunneling transistors," *Physica* C 368, pp. 337–342.

Makhlin, Y., G. Schön, and A. Shnirman, 2001, "Quantum-State Engineering with Josephson–Junction Devices,"*Rev. Mod. Phys.* 73, pp. 357–401.

Mooij, J.E., T. P. Orlando, L. Levitov, L. Tian, C. H. van der Wal, and S. Lloyd, 1999, "Josephson Persistent–Current Qubit, "*Science* 285, pp. 1036–1039.

Nicoletti, S., H., Moriceau, J. Villegier, D. Chateigner, B. Bourgeaux, C. Cabanel, and J. Laval, 1996, "Bi–epitaxial YBCO grain boundary Josephson junctions on $SrTiO_3$ and sapphire substrates", *Physica* C 269, pp. 255–267.

Nielsen, M.A., and I. L. Chuang, 2000, *Quantum Computation and Quantum Information*, Cambridge University Press, Cambridge, pp. 60–97, 277–352.

Spiller, T.P., 2000, "Superconducting Circuits for Quantum Computing,"*Fortschritte der Physik* 48, pp. 1075–1094. Also published in Braunstein, S. L., and H.–K. Lo (eds.), 2000, *Scalable Quantum Computers*, Wiley–VCH, Berlin, ISBN 3–527–40321–3.

Tsuei, C.C., J. Kirtley, C. Chi, L. Yu–Jahnes, A. Gupta, T. Shaw, J. Sun, and M. Ketchen, 1994, "Pairing Symmetry and Flux Quantization in a Tricrystal Superconduting Ring of $YBa_2Cu_3O_7-\delta$", *Phys. Rev. Lett.* 73, p. 593.

Tsuei, C.C., and J.R. Kirtley, 2000, "Pairing symmetry in cuprate superconductors,"*Rev. Mod. Phys.* 72, pp. 969–1016.

Zagoskin, A.M., 2002, "d–Wave superconductors and quantum computing," *Physica* C 368, pp. 305–309.

* cited by examiner

SUPERCONDUCTING LOW INDUCTANCE QUBIT

CROSS-REFERENCE TO RELATED APPLICATIONS

This application claims priority to U.S. provisional application Ser. No. 60/316,134, filed Aug. 29, 2001, which is incorporated herein by reference in its entirety.

This application is also related to the following applications: application Ser. No. 09/452,749 entitled "Permanent Readout Superconducting Qubit" filed Dec. 1, 1999; U.S. Pat. No. 6,803,599 B2, entitled "Quantum Processing System And Method For A Superconducting Phase Qubit" filed Jun. 1, 2001, and issued Oct. 12, 2004; application Ser. No. 10/006,787, entitled "Trilayer heterostructure junctions", filed Dec. 6, 2001; and application Ser. No. 09/839,637, entitled "Intrinsic Phase Shifter Quantum Bit with a Multi-terminal Junction and Loop with a Phase Shift", filed Apr. 20, 2001, all of which are incorporated herein by reference in their entirety.

FIELD OF THE INVENTION

This invention relates to quantum computing, and in particular to superconducting structures for use as phase qubits in quantum computing.

BACKGROUND

Research on what is now called quantum computing traces back to Richard Feynman, See, e.g., R. Feynman, *Int. J. Theor. Phys.*, 21, 467–488 (1982). Feynman noted that quantum systems are inherently difficult to simulate with classical (i.e., conventional, non-quantum) computers, but that this task could be accomplished by observing the evolution of another quantum system. In particular, modeling the behavior of a quantum system commonly involves solving a differential equation based on the Hamiltonian of the quantum system. Observing the behavior of the quantum system provides information about the solutions to the equation.

The quantum computer is rapidly evolving from a wholly theoretical idea to a physical device that will have a profound impact on the computing of tomorrow. A quantum computer differs principally from a conventional, semiconductor chip-based computer, in that the basic element of storage is a "quantum bit", or "qubit". A qubit is a creature of the quantum world: it can exist in a superposition of two states and can thereby hold more information than the binary bit that underpins conventional computing.

Quantum computing generally involves initializing the states of a set of N qubits (quantum bits), creating controlled entanglements among the N qubits, allowing the states of the qubit system to evolve, and reading the qubits afterwards. A qubit can be made from a system having two degenerate quantum states, i.e., states of equal energy, with a non-zero probability of the system being found in either state. Thus, N qubits can define an initial state that is a combination of $2^N$ classical states. This initial state is said to be entangled and will evolve, governed by the interactions which the qubits have both among themselves and with external influences. This evolution defines a calculation, in effect $2^N$ simultaneous classical calculations, performed by the qubit system. Reading out the qubits determines their states and thus the results of the calculations.

Initial efforts in quantum computing concentrated on "software development" or building the formal theory of quantum computing. Software development for quantum computing involves attempting to set up the Hamiltonian of a quantum system that corresponds to a problem requiring solution. Milestones in these efforts were the developments of Shor's algorithm for factoring of a natural number, see P. Shor, *SIAM J. of Comput.*, 26:5, 1484–1509, (1997), and Grover's algorithm for searching unsorted databases, see L. Grover, *Proc. 28th STOC*, 212–219, (1996). See also A. Kitaev, LANL preprint quant-ph/9511026 (1995).

One proposed application of a quantum computer is the efficient factorization of large numbers, a feat which becomes possible with the Shor algorithm. In applying such a capability, a quantum computer could render obsolete all existing "public-key" encryption schemes. In another application, a quantum computer (or even a smaller scale device such as a quantum repeater) could provide absolutely safe communication channels where a message cannot be intercepted without being destroyed in the process. See, e.g., H. J. Briegel, W. Dur, J. I. Cirac, P. Zoller, LANL preprint quant-ph/9803056 (1998).

One of the principal challenges in quantum computing is to establish an array of controllable qubits, so that large scale computing operations can be carried out. Showing that fault-tolerant quantum computation is theoretically possible opened the way for attempts at practical realizations of quantum computers. See, e.g., E. Knill, R. Laflamme, and W. Zurek, *Science*, 279, 342, (1998). Several physical systems have been proposed for the qubits in a quantum computer. One system uses molecules that have degenerate nuclear spin states, see N. Gershenfeld and I. Chuang, "Method and Apparatus for Quantum Information Processing", U.S. Pat. No. 5,917,322. In such a system, nuclear magnetic resonance (NMR) methods can read the spin states. These systems have successfully implemented a search algorithm, see e.g., M. Mosca, R. H. Hansen, and J. A. Jones, "Implementation of a quantum search algorithm on a quantum computer," *Nature*, 393:344–346, (1998) and references cited therein, and a number ordering algorithm, see e.g., L. M. K. Vandersypen, M. Steffen, G. Breyta, C. S. Yannoni, R. Cleve and I. L. Chuang, "Experimental realization of order-finding with a quantum computer," Los Alamos National Laboratory preprint quant-ph/0007017, (2000). The number ordering algorithm is related to the quantum Fourier transform, an essential element of both Shor's and Grover's algorithms. However, efforts to expand such systems to a commercially useful number of qubits have faced difficult challenges. One of the principal challenges in quantum computing is to establish an array of controllable qubits, so that large scale computing operations can be carried out.

In 1962, Josephson proposed that non-dissipating current would flow from one superconductor to another through a thin insulating layer, see B. D. Josephson, *Phys. Lett.*, 1:251, (1962). Since then, the so-called Josephson effect has been verified experimentally and has spawned a number of important applications of superconducting materials.

One physical implementation of a phase qubit involves a micrometer-sized superconducting loop with 3 or 4 Josephson junctions. See J. E. Mooij, T. P. Orlando, L. Levitov, L. Tian, C. H. van der Wal, and S. Lloyd, "Josephson Persistent-Current Qubit", *Science*, 285:1036–1039, (1999), which is incorporated herein by reference in its entirety. The energy levels (or basis states) of this system correspond to differing amounts of magnetic flux that thread the superconducting loop. Application of a static magnetic field perpendicular to the plane of the loop may bring two of these levels into degeneracy. Typically, external alternating current electromagnetic fields are applied to enable tunneling between non-degenerate states. Thus, the Josephson persistent-current qubit provides a mechanism for tuning the qubit basis states so that they become degenerate and thereby allow quantum interaction between the two states. In practice, this is achieved by inductively coupling a second superconducting loop to the loop that acts as a qubit, and by modulating the supercurrent through the second loop. However, it has been found that this inductive coupling limits the usefulness of the device, and a method for providing degenerate basis states that does not require interaction with the qubit would be ideal.

To address this problem, a ground state π-phase shifter (π-junction) can be included in a superconducting loop. See, e.g., G. Blatter, V. Geshkenbein, and L. Ioffe, "Design aspects of superconducting-phase quantum bits", *Phys. Rev. B*, 63, 174511, (2001) and references cited therein. Blatter et al., illustrate how to make use of π-junctions in a superconducting loop to shift the ground state phase by $\pm\pi/2$. Blatter et al., describe a π-junction using a superconductor-ferromagnet-superconductor junction structure, but teach away from the use of unconventional d-wave superconductors, because they are regarded to be nontrivial to fabricate.

Another implementation of a phase qubit is a permanent readout superconducting qubit (PRSQ), first disclosed by A. Zagoskin in commonly-assigned U.S. patent application Ser. No. 09/452,749, "Permanent Readout Superconducting Qubit", filed Dec. 1, 1999, incorporated herein by reference in its entirety. The PRSQ includes two regions of unconventional superconducting material, separated by a Josephson junction such as a grain boundary, and further having a crystal lattice mismatch. A first of the two superconducting regions is large, so that the phase of the superconductor is fixed, and a second of the two regions is mesoscopic in size. The second superconducting region forms a qubit having the basis states $\pm\phi_0$, where $\phi_0$ is a quantum of phase with respect to the phase $\phi_B$ of the large superconducting region.

Two types of superconductors are regularly used nowadays: conventional superconductors and unconventional superconductors. The most important phenomenological difference between the unconventional superconductors and conventional superconductors is in the orbital symmetry of the superconducting order parameter. In the unconventional superconductors, the pair potential changes sign depending on the direction of motion in momentum space. This has now been experimentally confirmed; see e.g., C. C. Tsuei and J. R. Kirtley, *Rev. Mod. Phys.*, 72, 969, (2000).

A system has recently been proposed wherein a network of grain boundaries links a group of polygon-shaped crystal superconductors. See, e.g., C. Tsuei, and J. Kirtley, "Pairing symmetry in cuprate superconductors", *Rev. Mod. Phys.*, 72, 969 (2000). The structure can be formed using a technique described in C. Tsuei, J. Kirtley, C. Chi, L. Yu-Jahnes, A. Gupta, T. Shaw, J. Sun, and M. Ketchen, "Pairing Symmetry and Flux Quantization in a Tricrystal Superconducting Ring of $YBa_2Cu_3O_{7-\delta}$", *Phys. Rev. Lett.*, 73, 593 (1994). The superconducting materials can violate time reversal symmetry and it can be shown that flux can be trapped and maintained in the region where three of the crystals meet. Each of the crystals has an objective crystal lattice alignment, and the network can in principle be unlimited in size. The trapped flux can be used as a qubit in quantum computing, although the usefulness of the structure is limited since it is difficult to efficiently interact with, and provide control of, the intersection points to measure the flux without disrupting the entire structure. A mechanism that would allow for control and interaction of such a system would be extremely useful.

In general, then, given the potential of quantum computing, there is a need for robust and commercially scalable qubit designs.

SUMMARY OF THE INVENTION

In accordance with the present invention, a superconducting low inductance qubit (SLIQ) is presented. In some embodiments, a SLIQ provides a robust, scalable technology, which can form the basis of a quantum register such as may be used in large-scale computations. A SLIQ according to the present invention includes a superconducting loop with a first part and a second part. The first part of the loop includes a Josephson junction between two superconducting materials that violate time reversal symmetry. The superconducting materials can violate time reversal symmetry by having an order parameter with a dominant component that has a pairing symmetry with non-zero angular momentum. The high temperature superconductors $YBa_2Cu_3O_{7-x}$ ("YBCO"), $Bi_2Sr_2Ca_{n-1}Cu_nO_{2n+4}$, $Tl_2Ba_2CuO_{6+x}$, and $HgBa_2CuO_4$ (where n is a natural number, and x is a decimal preferably between 0.0 and 1.0), are examples of superconductors that have non-zero angular momentum and dominant d-wave pairing symmetry, whereas the low temperature superconductor $Sr_2RuO_4$, or the heavy fermion material $CeIrIn_5$, are examples of p-wave superconductors that have non-zero angular momentum. In the case of YBCO, x is ideally 0.06 in order to maximize the superconducting temperature, $T_c$.

The second part of the loop includes a superconducting material that is coupled to the first part of the loop so that it spans across the Josephson junction formed by the two superconducting materials of the first loop. In some embodiments of the invention, the second part of the loop is comprised of a conventional superconducting material. In some embodiments, the superconducting material of the second part of the loop can be coupled to the material of the first part of the loop through one or more c-axis heterostructure tunnel junctions.

In some embodiments of the invention, the first part of the loop can include a Josephson junction having a π-phase shift such that the loop can maintain a bistable state that can be used for a basis state of the qubit. The Josephson junction can, for example, be a 45° asymmetric grain boundary, wherein a first superconducting material has a misorientation angle of 0° with respect to the grain boundary, and a second superconducting material has a 45° misorientation angle with respect to the grain boundary.

The heterostructure forms a superconducting loop that permits the circulation of supercurrent. The state of the supercurrent is degenerate with respect to the direction of circulation and thus the direction of circulating current in the loop can form the basis states of the qubit. The qubit structure provides a stable system for quantum evolution and for qubit operations such as readout, initialization, entanglement, and application of quantum gates.

In operation, the superconducting loop is preferably cooled to a temperature sufficient to remove noise due to thermal excitation in the system. The state of the qubit system can then be initialized by directing the current of the loop in either the clockwise or counter-clockwise direction. The qubit can then evolve in a quantum superposition of its basis states. After some period of evolution, as determined by the quantum computation, the state of the qubit can be read out. Reading out the state of the qubit can involve grounding the qubit, which collapses the wavefunction of the qubit into one of the basis states, and then applying a mechanism to determine the direction of current circulation in the loop.

Another embodiment of the invention can include a Josephson junction formed in the second part of the loop, and a pair of terminals on either side of the Josephson junction. The terminals can further enable initialization, readout, and quantum gate applications. By passing a current from a first of the terminals to a second, the state of the qubit can be biased.

Some embodiments of a method for fabricating the structure of qubit 100 can include providing a bi-crystal substrate, depositing a first layer of unconventional superconducting material on the substrate, patterning the first layer to form at least one superconducting microbridge that includes a grain boundary that acts as junction, further depositing a layer of an insulating material to form layer, exposing part of the underlying first layer as required at least one on either side of the grain boundary, for at least one of the microbridges and depositing a thin layer to act as an interface for the c-axis tunnel junction, and depositing a second layer of a conventional superconductor.

Entanglement of the qubits can include providing a mechanism for coupling at least two of the SLIQs together. The mechanism for coupling the SLIQs can be switchable, such that coupling of the qubits can be modulated. A coupling mechanism can include directly coupling a part of the qubit loop from different qubits together, and can further include providing a mechanism for modulating the coupling between the qubit loops so that it is either open or closed, for example a single electron transistor.

The present invention further involves: a quantum computing method, comprising: cooling a qubit structure that includes a plurality of superconducting low-inductance qubits, and wherein the cooling lowers the temperature of the qubit structure sufficiently that the superconducting low-inductance qubits become superconducting, and thermal excitations are sufficiently suppressed to maintain coherence for a calculation; establishing a quantum state of a supercurrent in each of the superconducting low inductance qubits, wherein the quantum state is a superposition of a first state having a first current direction and a second state having a second current direction; allowing the quantum state to evolve; and measuring the supercurrent in each of the superconducting low inductance qubits, wherein each of the superconducting low inductance qubits comprises: a loop formed from a first and a second unconventional superconducting material, and a third superconducting material and a first Josephson junction between the first and second unconventional superconducting materials, and a second and third coherent Josephson junction between the first and second unconventional superconducting materials and the third superconducting material, and wherein the qubit structure further comprises a mechanism for coupling at least two of the superconducting low inductance qubits.

The present invention further involves a superconducting structure comprising: a first unconventional superconducting material; a second unconventional superconducting material; a means for coupling the first and second unconventional superconducting materials; a third superconducting material that overlies a part of the first and a part of the second unconventional superconducting materials; a means for coherently coupling the third superconducting material to the first unconventional superconducting material; a means for coherently coupling the third superconducting material to the second unconventional superconducting material; and an insulating material separating the first and second unconventional superconducting materials from the third superconducting material, wherein flux can be stored.

The present invention further involves quantum computing apparatus, comprising: a qubit structure that includes a plurality of superconducting low-inductance qubits, that is cooled to a sufficiently low temperature that the superconducting low-inductance qubits become superconducting, and thermal excitations are sufficiently suppressed to maintain coherence for a calculation; means for establishing a quantum state of a supercurrent in each of the superconducting low inductance qubits, wherein the quantum state is a superposition of a first state having a first current direction and a second state having a second current direction; means for allowing the quantum state to evolve; and means for measuring the supercurrent in each of the superconducting low inductance qubits, wherein each of the superconducting low inductance qubits comprises: a loop formed from a first and a second unconventional superconducting material, and a third superconducting material and a first Josephson junction between the first and second unconventional superconducting materials, and a second and third coherent Josephson junction between the first and second unconventional superconducting materials and the third superconducting material, and wherein the qubit structure further comprises a means for coupling at least two of the superconducting low inductance qubits.

These and other embodiments are further described below with respect to the following figures.

DETAILED DESCRIPTION

Terminology

Figure 1:
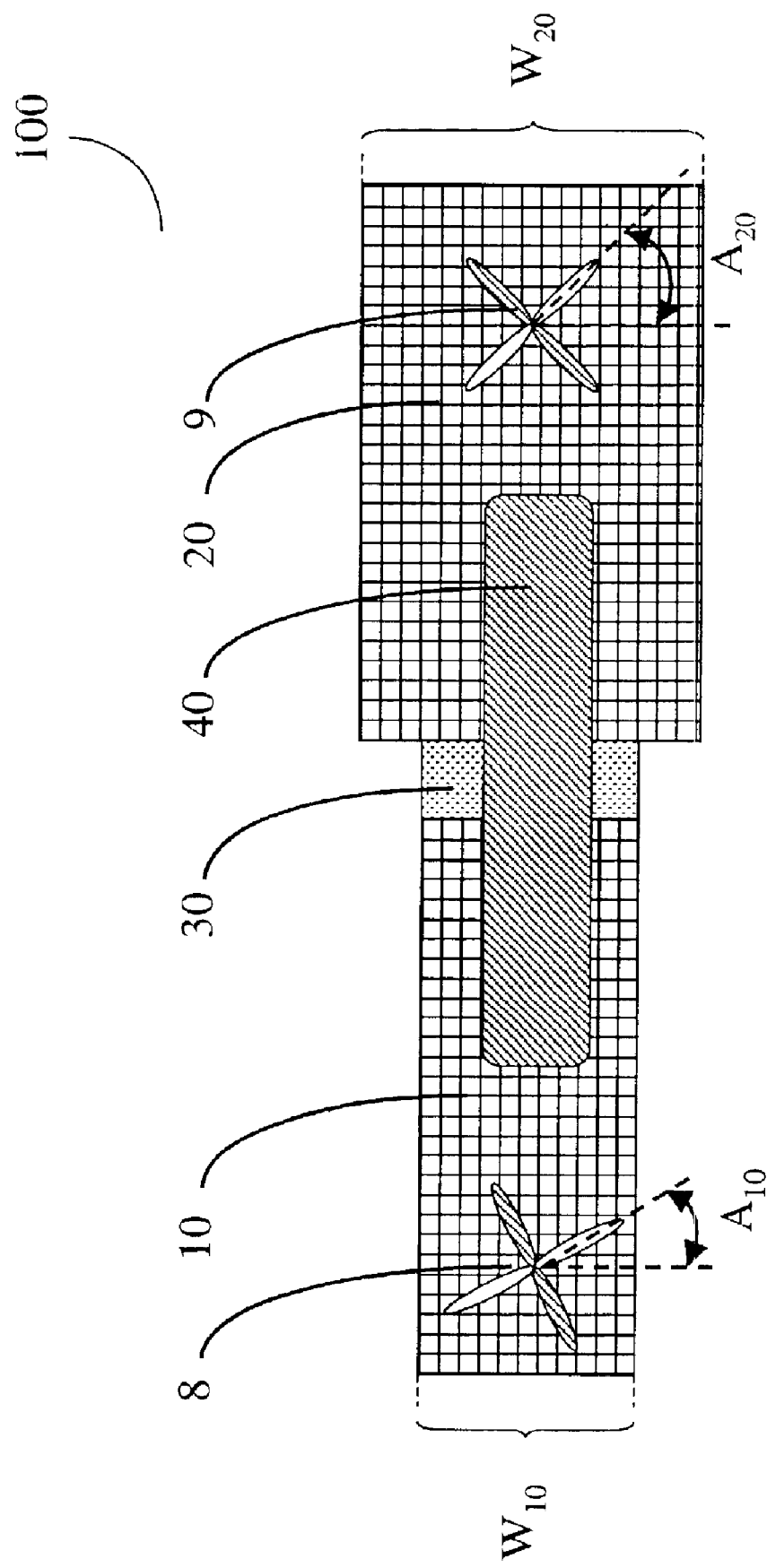
FIG. 1 illustrates a plan view of an embodiment of a superconducting low inductance qubit according to the present invention.

The following terms are used herein with meanings that would be familiar to one of ordinary skill in the art of quantum computing, but a brief explanation is presented for the purpose of clarity. The reader is also referred to standard works of reference in the field, such as: *Quantum Computation and Quantum Information*, M. A. Nielsen, and I. L. Chuang, Cambridge University Press, (2000); and *Scalable Quantum Computers—Paving the Way to Realization*, S. L. Braunstein and H.-K. Lo (eds), Wiley-VCH, (2001). A standard work on superconductivity is: J. R. Schrieffer and M. Tinkham, "Superconductivity", *Reviews of Modern Physics*, 71(2), S313–S317, (1999).

Superconductor, or superconducting material: A material whose electrical resistance disappears completely under certain conditions. Most superconducting materials only superconduct over narrow ranges of temperature, current, pressure, and magnetic field. Theoretically, a loop of superconducting material is able to support a flowing electric current for an infinite length of time. Although the earliest discovered superconductors were metals such as lead, mercury, tin, and aluminum, non-metals such as organic materials and ceramics have more recently been shown to be superconducting.

Supercurrent: A current that flows in a superconductor. It may travel without an applied potential difference.

Critical temperature, $T_c$: A superconductor is characterized by a critical temperature, $T_c$, above which the material is not superconducting. Most metals that have a superconducting regime are referred to as "low-$T_c$" superconductors because they must be cooled to temperatures close to the absolute zero of temperature—often less than 1 K—before superconductivity is observed. Materials referred to as "high-$T_c$" superconductors need only be cooled to temperatures ranging from about 10 K to greater than 100 K before the onset of superconductivity can be detected.

Critical Current, $I_c$: The critical current is the current, above which, a superconducting material is unable to support a supercurrent.

Superconductivity: the phenomenon whereby the electrical resistance of a material essentially vanishes, permitting unimpeded current flow. The most widely accepted explanation of superconductivity is Bardeen-Cooper-Schrieffer ("BCS") theory. According to this theory, resistance-free current flow arises from a coupling between the electrons and the crystal lattice: as the negatively charged electrons pass through the material, the crystal lattice, comprised of positively charged nuclei, deforms. Although variations of the basic theory have been proposed to account for superconductivity in different types of materials, the unifying principle is that electrons in a superconductor associate in pairs, known as Cooper pairs. Below the critical temperature, electrons near the Fermi energy that form Cooper pairs become separated in energy from unpaired electrons by a superconducting energy gap, $\Delta$. The energetic factors that normally disfavor electron pairing are offset by their interaction with the lattice and these electrons become carriers of supercurrent.

Cooper pair: the basic unit of supercurrent in a superconductor is a pair of electrons that is coupled by weak interactions to lattice vibrations (phonons). The Cooper pair is central to BCS theory. Cooper pairs comprise long-range coupling of electrons, often across many unit cells, and superconductivity arises from the collective motion of many Cooper pairs. Electrons that form a Cooper pair are in a state that has a zero net momentum and zero net spin. The relative orbital angular momentum of the Cooper pair can have a value of zero (referred to as an "s-wave"), one (referred to as a "p-wave"), two (referred to as a "d-wave"), and so forth.

Conventional superconductor: A superconducting material with an isotropic order parameter, i.e., an s-wave superconductor. Although most low temperature superconductors are conventional, a few are not. An example of a conventional superconductor is Aluminum.

Unconventional superconductor: A superconducting material with either an anisotropic order parameter or one that violates time reversal symmetry. Examples include all non s-wave superconducting material, e.g., d-wave and p-wave materials such as $YBa_2Cu_3O_{7-x}$, $Bi_2Sr_2Ca_{n-1}Cu_nO_{2n+4}$, $Tl_2Ba_2CuO_{6+x}$, and $HgBa_2CuO_4$. $Sr_2RuO_4$ and the heavy fermion material $CeIrIn_5$ are also examples of unconventional superconductors. It has been found that most high temperature superconductors known at this time are unconventional.

Coherence Length: The coherence length can be thought of as the "size" of a Cooper pair and represents the shortest distance over which superconductivity can be established in a material. Coherence lengths are typically on the order of 1,000 Å, though they can be as small as 30 Å in superconducting copper oxides.

Quasi-particle: A bare (normal) particle that is "surrounded" by a cloud of other particles. Quasi-particles behave similarly to bare particles, but usually have a larger effective mass due to the cloud, which moderates their interactions with other particles.

Heavy fermion material: The electronic structures of certain elements with high atomic numbers are influenced by relativistic effects. The motions of their core electrons, confined to extremely tight regions in proximity to highly charged nuclei, are governed by a relativistic correction that makes them appear to be heavier than the electrons of other elements. This has a measurable effect on their properties, such as electrical conductivity. Thus, materials containing such elements are referred to as heavy fermion materials. Uranium is an example of a heavy fermionic element, and examples of such heavy fermion superconducting material include: $UPt_3$ and $URu_2Si_2$.

Mesoscopic: a class of solid systems of intermediate size, i.e., macroscopic but small enough (e.g., $\leq$ about 1 $\mu$m in each direction) to support discrete quantum states, and small enough that quantum interference is very important, since at low enough temperatures (e.g., <1K) the phase coherence length of electrons or quasiparticles exceeds the size of the system. See, A. Zagoskin, *Quantum Theory of Many Body Systems*, Springer, (1998), at page 19, (citing Y. Imry, "Physics of Mesoscopic Systems", in *Directions in Condensed Matter Physics: Memorial Volume in Honor of Shang-Keng Ma*, G. Grinstein, G. Mazenko, eds., World Scientific, (1986)).

Josephson junction: A Josephson junction comprises a pair of superconducting materials separated by a weak link, such that a non voltage current, i.e., supercurrent, flows across the link. A weak link is thought of as a region where the number of superconducting carriers, i.e., Cooper pairs is diminished. The weak link may be formed by a number of different means, including, principally: a thin layer of insulating material, across which charge carriers tunnel, giving rise to a "tunnel junction"; a normal non-superconducting, metal that is traversed by Cooper pairs; a grain boundary junction; a physical constriction formed by a point contact or an aperture; and a trench etched in, for example, a thin film of superconducting material. In general, then, a Josephson junction can be modeled as an interruption in the translational symmetry of a bulk of superconducting material. Typically, the interruption is on the order of the coherence length of the superconducting material. The Josephson junction has become a term of art applied to all structures which exhibit the Josephson effect.

Coulomb energy: The energy, $E_C=Q^2/2C$, to move charge Q on to an island with a total capacitance C.

Unit Cell: A crystalline material has a unit cell that defines the smallest repeating unit from which, through translational symmetry operations, the crystal can be described. The unit cell is defined by 3 lattice vectors, each of which defines a fixed direction within the crystal, and the angles that those lattice vectors make with respect to each other. Each lattice vector has an associated length, denoted a, b, and c, that corresponds to the length of the side of the unit cell in a direction parallel to the lattice vector. The three lattice vectors may also be denoted by, respectively, [100], [010] and [001] unit vectors. Unit cells fall within one of seven crystal systems, known as monoclinic, triclinic, rhombohedral, orthorhombic, tetragonal, cubic and hexagonal.

Orthorhombic: A crystalline material is in the orthorhombic crystal system if the a-, b-, and c-axes of its unit cell are mutually orthogonal, and if the lattice parameters are such that a≠b≠c.

YBCO: A high temperature, unconventional superconductor with a stoichiometry given generally by $YBa_2Cu_3O_{7-x}$ where x is a number between 0 and 1. When YBCO is referred to herein, it is assumed that any material within the family of compounds that correspond to values of x between 0 and 1 can be used. The crystal structure of YBCO is orthorhombic, but the a- and b-lattice parameters are about the same length while the c-lattice parameter is longer. Typically, the coherence length in the direction of the a- and b-axis is longer than in the c-axis direction. Correspondingly, the critical current in the c-axis direction is lower than that in other directions. The order parameter in the c-axis direction is a subdominant order parameter of YBCO and is s-wave versus d-wave for a-axis and b-axis.

Order parameter: This term is associated generally with phase transitions, wherein some property can be characterized as being zero on one side of the phase transition and non-zero on the other side. In the case of a superconductor, the transition between the non-superconducting state and the superconducting state can be considered to be a phase transition. According to Ginzburg Landau theory, an early theory of superconductivity, the number density of superconducting charges is expressed as the amplitude of a quantity, $\Psi$, that resembles a wavefunction. For an s-wave material, the order parameter is given by the product of the superconducting energy, $\Delta$, and the phase of $\Psi$. The order parameter thus vanishes above the critical temperature.

Parity key: a parity key is a special form of a single-electron transistor (SET) in that it is superconducting. The parity key only passes Cooper pairs, and only at certain gate voltages. (See P. Joyez, et al., "Observation of Parity-Induced Suppression of Josephson Tunneling in the Superconducting Single Electron Transistor", *Physical Review Letters*, 72:2458–2461, (1994)).

Single electron Transistor (SET): A SET is a mesoscopic device that permits the prototypical study of non-collective behavior of electrons. A mesoscopic "island", whose dimensions are of the order of 1,000 Å, is constructed in a manner that a gate electrode can control the tunneling on and off the island. At low temperatures, the dimensions are sufficiently small that only a single particle at a time can tunnel on to the island. By tuning the operating parameters, a situation can arise in which exactly half an electron is on the island, thereby introducing a degeneracy with respect to the presence or absence of an electron on the island. If the island is superconducting, the charge carriers are Cooper pairs and a double elementary charge oscillation can be established.

Basis States: When a qubit is decoupled from its surroundings, the effective Hamiltonian describes the quantum system of the qubit as proportional to a component of spin angular momentum $\hat{\sigma}_x$, whose corresponding operator is represented by a Pauli matrix. The qubit basis states are by convention assigned to be specific states, i.e., eigenstates, from a particular operator. Conventionally the qubit basis states are expressed in the Z-diagonal basis, in which they are the first and second eigenstates (corresponding to the first and second eigen values) of the $\hat{\sigma}_Z$ or "sigma Z" Pauli matrix. The basis states of a qubit are also called bit states. The first basis state, labeled |0>, corresponds to the vector $$\begin{bmatrix}1\\0\end{bmatrix}$$

and the second basis state |1> corresponds to the vector $$\begin{bmatrix}0\\1\end{bmatrix}.$$

In this basis, the action of the Pauli matrix, $$\hat{\sigma}_x = \begin{bmatrix}0 & 1\\1 & 0\end{bmatrix}$$

rotates each of the basis states into the other basis state (i.e., $\hat{\sigma}_x|0>=|1>$ and $\hat{\sigma}_x|1>=|0>$). The effective Hamiltonian describing the qubit includes a term proportional to $\Delta_T$ (I) $\hat{\sigma}_x$, wherein the tunneling matrix element $\Delta_T$ (I) can vary over a large range depending on the Coulomb energy and the Josephson energy of the qubit. In some embodiments of the invention, the tunneling frequency, $\omega_T$, can be about 10 GHz. In order to successfully implement quantum algorithms, operations performed on a qubit preferably have a frequency whose associated energy exceeds the energy associated with the tunneling frequency, given by $\Delta E_T = \hbar \omega_T$, or the quantum system can become unpredictable.

Superconducting Low Inductance Qubit

The present invention is directed to a superconducting low-inductance qubit (SLIQ) and a method of making the same. The qubit of the present invention has a double-well potential similar to that of other qubits in the art. Degenerate states arise in the qubit of the present invention because it is frustrated with a half-flux of quantum. The SLIQ includes a loop that comprises superconducting materials, and that encompasses magnetic flux. In a flux qubit, the basis states are two alternate directions of circulating current. From elementary application of Lenz's law, a circulating current gives rise to a magnetic flux perpendicular to the plane of circulation of the current. The qubit of the present invention comprises a loop that has a π-junction and two other junctions, each of which lies between a pair of superconducting materials. In essence, according to the present invention, a π-junction can easily be realized with a grain boundary Josephson junction and YBCO.

The inductance of the SLIQ of the present invention is low. The inductance of the SLIQ of the present invention can be lower than the inductance of other loop-based superconducting qubits known in the art. It is advantageous for the qubit of the present invention to have low inductance so that it does not couple to external magnetic fields. The area of the loop, is the principal factor on which the inductance depends. Such a low inductance is achieved because the loop of the SLIQ preferably comprises a grain boundary junction, thereby permitting the loop to occupy a smaller physical area than the loop of other qubits in the art. The grain boundary junction in the SLIQ of the present invention behaves like a π-junction and frustrates the current in the loop without requiring an external source of frustration. Alternatively without loss of generality, aspects of the present invention can be made of large inductance qubits known in the art.

The fact that the structure does not need to be biased means that the loop can be small in size. Areas of the loop of the qubit of the present invention are preferably mesoscopic in size. Typical areas for the loop of the qubit of the present invention are $0.3\mu$ by $0.8\mu$ (wherein $1\mu=10^{-6}$ m). Loops of the present invention may be as large as about $1\mu$ by $5\mu$ and may be as small as about $0.1\mu$ by $0.1\mu$. It is not required that the two dimensions of the loop be different from one another.

FIG. 1 shows a plan view of an embodiment of a structure 100 that can operate as a superconducting low inductance qubit according to the present invention. Qubit 100 includes superconducting materials 10 and 20 coupled through a junction 30. Superconducting materials 10 and 20 are further coupled by superconducting material 40 in order to form a loop. In FIG. 1, the loop comprises, in order, superconducting material 40, superconducting material 10, π-junction 30 and superconducting material 20. The flux that is normal to the loop is in the plane of FIG. 1. The first superconductor can have a width $W_{10}$ that is approximately the same as the width of a second superconductor $W_{20}$. See, e.g., E. Il'ichev, V. Zakosarenko, R. IJsselsteijn, H. Hoenig, V. Schultze, H. Meyer, M. Grajcar, and R. Hlubina, "Anomalous Periodicity of the Current-Phase Relationship of Grain-Boundary Josephson Junctions in High-$T_c$ Superconductors", Los Alamos National Laboratory preprint, cond-mat/9811017 (1998), which is incorporated herein by reference.

A first part of the qubit loop can include a π-junction 30, between two superconducting materials 10 and 20, with pairing symmetries that violate time reversal symmetry. In FIG. 1, the π-junction is preferably a grain boundary between the two materials 10 and 20. A second part 40 of the loop, as illustrated in FIG. 1, can span across the grain boundary 30, and couple to the superconducting materials 10 and 20 respectively, through at least two c-axis heterostructure tunnel junctions (not shown in FIG. 1). The material 40, can be a conventional superconducting material such as niobium or aluminum.

In general, superconducting material thickness should exceed the London penetration depth $\lambda_L$ of the superconducting material. For Niobium, the London penetration depth is 470 Å and for Al the London penetration depth is 500 Å. Therefore Aluminum films of 250 nm thickness, i.e., five times $\lambda_L$, are reasonable. Films as thin as twice the London penetration depth and as thick as ten times the penetration depth are suitable in the absence of other problems such as the appearance of so-called "weak spots" (i.e., locations where spurious flux can be pinned.

Junction 30 is preferably a grain boundary junction. Junction 30 can, for example, be a 45° mismatched grain boundary. A grain boundary is formed when the crystal lattices of two adjacent superconductors are misaligned. The characteristics of high-temperature superconductor grain boundary junctions are well known. See, e.g., E. Il'ichev, M. Grajcar, R. Hlubina, R. Ijsselsteijn, H. Hoenig, H. Meyer, A. Golubov, M. Armin, A. Zagoskin, A. Omelyanchouk, and M. Kupriyanov, "Degenerate ground state in a mesoscopic $YBa_2Cu_3O_{7-x}$ grain boundary Josephson junction," LANL preprint, cond-mat/0102404 v2 (2001) which is incorporated herein by reference, and the references cited therein.

A grain boundary can behave as a Josephson junction (often referred to as a grain boundary Josephson junction). Since the orientation of the order parameter of each of the superconductors is closely tied to the crystal lattice, the current-phase relationship across the grain boundary junction depends on the crystal lattice misalignment of the superconductors with respect to the boundary between them. When the faceting and roughness of the grain boundary is minimized, it can be considered to be a clean junction, wherein the ground state phase difference $\Delta\Phi$ across the boundary is mainly due to the misorientation angle. Other contributions to the phase difference across a junction depend on the dynamics of a particular Josephson junction and the circuit in which it is embedded. The angle $A_{10}$ indicates the angle of orientation of the crystal lattice of a first superconducting material 10 with respect to the grain boundary, and the angle $A_{20}$ indicates the angle of orientation of the crystal lattice of a second superconducting material 20 with respect to the grain boundary. In FIG. 1, superimposed on superconductors 10 and 20 are representations of the order parameters 8 and 9 of each material. The order parameters are anisotropic and their alignment is principally governed by the crystal lattice of each material. Order parameters 8 and 9, as depicted, are d-wave order parameters, though it is understood that other anisotropic order parameters are consistent with the present invention. The crystal lattice orientations of the superconductors 10 and 20 can be such that the grain boundary of junction 30 acts as a π-junction.

In some embodiments of the invention, the grain boundary of junction 30 can have a crystal lattice misorientation and a Josephson energy that causes a phase difference $\Delta\Phi=\pi$ across the boundary. This phase difference can cause a bi-stable degeneracy in the state of the current in the loop, wherein the current can assume two different directions of circulation through the loop. In both directions of circulation, the magnitude of current is equal, and thus each of the directions occurs with equal probability, and can form the basis states of a qubit such as qubit 100.

Figure 2:
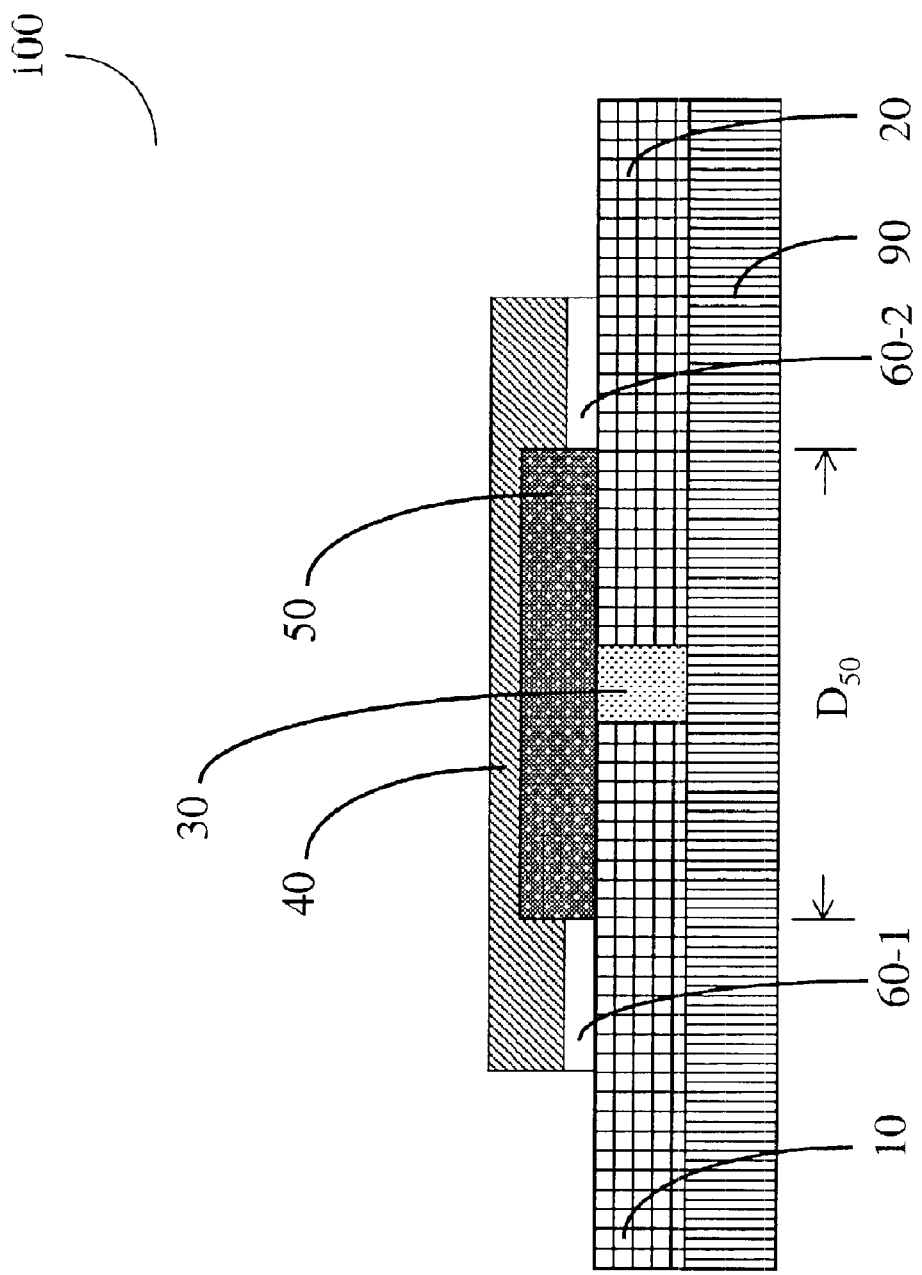
FIG. 2 illustrates a cross-sectional view of an embodiment of a superconducting low inductance qubit according to the present invention.

In an embodiment of the present invention, the Josephson junction 30 can have a Josephson energy that is approximately equal to the Josephson energies of the junctions 60-1 and 60-2, FIG. 2. In such a configuration, the phase shift across the grain boundary of junction 30 may be about π and provide for a bistable junction suitable for supporting degenerate states of different current directions. In such an embodiment, the grain boundary can have a low angle of misorientation, such as where $A_{10}$ is 0° and $A_{20}$ is 22.5°.

In an embodiment of the invention, the misorientation of order parameter relative to the grain boundary junction 30 can be asymmetric, moving from superconductor 10 to superconductor 20. This is referred to as an asymmetric grain boundary Josephson junction. The angle of misorientation is preferably from about 0° to about 45° asymmetrically. For example, in a preferred embodiment, the angle $A_{10}$ can be 0° and the angle $A_{20}$ can be 45° with respect to the orientation of the grain boundary. Such a pair of angles can be denoted 0°-45°. In another embodiment, $A_{10}$ can be 0° and $A_{20}$ can be 40°, denoted 0-40°. In another embodiment $A_{10}$ can be 0° and $A_{20}$ can be 22.5°, denoted 0°-22.5°. In still another embodiment, the pair angles is 0°-30°. In an alternative embodiment of the invention, the angle of misorientation of the order parameter relative to the grain boundary junction 30 can be symmetric when moving from superconductor 10 to superconductor 20. For example, the angle $A_{10}$ can be −15° and the angle $A_{20}$ can be 15° with respect to the orientation of the grain boundary, denoted 15°-15°. Still other embodiments include symmetrically disposed angles such as 20°-20°, and 22.5°-22.5°.

Time reversal symmetry breaking at a grain boundary junction, such as junction 30 between two unconventional superconductors 10 and 20, can give rise to two ground degenerate states. Although the states are degenerate, they are differentiable. The two degenerate states can also exist with equal probability. The degenerate ground states have been proposed as the basis states of a qubit. See, e.g., U.S. patent application Ser. No. 09/452,749, "Permanent Readout Superconducting Qubit", filed Dec. 1, 1999, in which a superconducting phase qubit is described that includes a bulk superconductor and a mesoscopic island, wherein the island is separated from the bulk by a Josephson junction such as a grain boundary. A mesoscopic island highly sensitive to the presence of a single Cooper pair.

As shown in FIG. 1, some embodiments of qubit 100 can be a SLIQ, which includes a loop, wherein the loop includes a π-junction as junction 30. The π-junction can be any Josephson junction having a π-phase drop across it. For example, as is shown as junction 30 in FIG. 1, a π-junction can be a grain boundary in a superconducting material that violates time reversal symmetry. The angle of crystal misalignment with respect to the grain boundary of junction 30 can be 0° on one side and 45° on the other (see Il'ichev et al., cond-mat/0102404). Materials that violate time reversal symmetry can be unconventional superconductors such as $YBa_2Cu_3O_{7-x}$, wherein x is between about 0.6 and 0.0. Further examples of materials that violate time reversal symmetry include the high temperature superconductors: $Bi_2Sr_2Ca_{n-1}Cu_nO_{2n+4}$ wherein n is a natural number, $Tl_2Ba_2CuO_{6+x}$ wherein x is typically a decimal number between 0.0 and 1.0, and $HgBa_2CuO_4$. These materials have dominant d-wave pairing symmetry. The low temperature superconductor $Sr_2RuO_4$, and the heavy fermion material $CeIrIn_5$, are examples of p-wave superconductors that also have non-zero angular momentum and violate time reversal symmetry.

Embodiments of the present invention can make use of a variety of grain boundary orientations alone or in combination. These include [001]-tilt, [100]-tilt, and [010]-twist junctions, where [100] and [001] are unit vectors in the plane of the grain boundary Josephson junction and [010] is normal to the plane of the junction. Tilt and twist are rotations around the designated vector are described in H. Hilgenkamp and J. Mannhart, "Grain boundaries in high-$T_c$ superconductors", *Reviews of Modern Physics*, 74,485–544, (April 2002). Embodiments of the present invention make use of various grain boundary orientations and superconducting materials.

For Josephson junctions there exists a certain length that the distance between superconductors (e.g., the thickness of grain boundary junction 30) cannot greatly exceed, or negligible current through the junction will result. Such a length is given by the thickness of the junction at its thinnest point. This thickness, and details of transport across the layer, differ with material. The characteristic lengths of interest in the present invention, which are collectively called coherence lengths, have different names and values from one another. The coherence length, $\xi$, of the superconductor is important for insulating barriers, where tunneling is the current transport mechanism. In clean metallic weak links, the correlation length of the metal, given by $\hbar v_F/kT$, is the relevant quantity, where $v_F$ is the Fermi velocity, k the Boltzman constant and T is temperature. In dirty links, where the mechanism of current transmission across the junctions is by diffusion, the characteristic length is $\sqrt{\hbar D/kT}$, where D is an empirically derived diffusion coefficient. For a c-axis Josephson tunnel junction between YBCO and Al that uses an insulator, 10–50 nm is an appropriate insulating gap for Josephson junction operation.

FIG. 2 shows a cross-sectional view of an embodiment of qubit 100. Insulating material 50 is inside the loop of qubit 100, and magnetic flux comes out of the plane of FIG. 2, through insulating material 50. Thus, in cross section, insulating material 50 presents an aperture. The size of the aperture is represented approximately by the thickness of the film of insulating material multiplied by its length, $D_{50}$. The film thickness should exceed the coherence length of the superconductors 40 and 60. If 40 is a metal such as Aluminum, a film thickness of 100 nm should be sufficient. Given the physical constraints involved in patterning three elements such as the grain boundary 30 and junctions 60-1 and 60-2, a length of about 200 nm of the aperture would be typical. In other embodiments, the aperture may be about 150 nm by about 250 nm.

Insulating materials 50 for the SLIQ include aluminum oxide ($Al_2O_3$) and silicon dioxide ($SiO_2$). Commercial superconducting fabrication facilities such as IPHT-Jena, in Jena, Germany, and HYPRES Inc., of Elmsford, N.Y., use both of these materials. $Al_2O_3$ has been used to make Josephson junctions between Niobium and Aluminum, e.g., $Nb/Al_2O_3/Nb$ and $Al/Al_2O_3/Al$. $Al_2O_3$ is easily applied by plasma enhanced chemical vapor deposition (PECVD).

As shown in FIG. 2, a first part of the qubit loop can include a first superconductor 10 and a second superconductor 20, separated by a π-junction 30 and deposited on a substrate 90. FIG. 2 further illustrates a second part of the qubit loop that includes a superconducting material 40 spanning grain boundary junction 30, separated from a first part of the loop by an insulating material 50 and normal conducting materials of junctions 60-1 and 60-2. Superconducting material 40 can be deposited on insulating material 50 and separated from superconducting materials 10 and 20 by c-axis tunnel junctions 60-1 and 60-2, respectively. Junctions 60-1 and 60-2 serve to disrupt the loop. Superconductor 40 is coupled to the first portion of the qubit loop through junctions 60-1 and 60-2. The interface material of junctions 60-1 and 60-2, between the first and second part of the qubit loop can be a thin film. The materials of junctions 60-1 and 60-2 can have a thickness $T_{60-1}$ and $T_{60-2}$, of about 8 nm to about 20 nm.

In a preferred embodiment, junctions 60-1 and 60-2 are c-axis tunnel junctions. A c-axis tunnel junction can be characterized as consisting of two superconductors with different pairing symmetries, coupled together through a normal metal barrier. The c-axis tunnel junctions can include a first superconducting material that violates time reversal symmetry and makes up one side of the grain boundary junction (superconducting material 10 or 20 in FIG. 1, for example), and a second, conventional superconductor (superconducting material 40), separated by a normal conductor tunnel barrier (c-axis tunnel junctions 60-1 and 60-2, for example). The first superconducting material can have a thickness of about 100 to about 200 nm. A material forming a normal conductor tunnel barrier can be a normal metal such as gold (Au), silver (Ag), platinum (Pt), or palladium (Pd). Alternatively, it can be a semiconducting material such as silicon (Si), or gallium arsenide (GaAs). The normal metal layer can be deposited between the two superconductors, and can couple in a plane perpendicular to the surface of the time reversal symmetry breaking material, such that current must travel along the c-axis of the material in order to tunnel through the normal metal barrier. The parameters of the junction depend on the embodiment of the invention, but the normal metal layer can consist of gold (Au) having a thickness ranging between about 8 and about 20 nm. The c-axis tunnel junctions can have a second superconducting material in common such that a coupling is formed across the grain boundary between the two junctions. The second superconducting material can be an s-wave superconductor such as niobium (Nb), lead (Pb), or aluminum (Al), and can have a thickness of about 100 nm to about 300 nm.

The behavior of c-axis tunnel junctions, e.g., junctions 60-1 and 60-2 in FIG. 2, has been reported elsewhere. See, e.g., P. Komissinkiǐ, E. Il'ichev, G. Ovsyannikov, S. Kovtonyuk, M. Grajcar, Z. Ivanov, Y. Tanaka, N. Yoshida, and S. Kashiwaya, "Superconducting current-phase relation in Nb/Au/(001)YBa$_2$Cu$_3$O$_x$ heterojunctions", Los Alamos National Laboratory preprint, cond-mat/0008077 v2 (2000), in which the time reversal symmetry breaking material investigated was the d-wave superconductor YBa$_2$Cu$_3$O$_{7-x}$ ("YBCO"), but the junction properties can be reproduced for any material that breaks time reversal symmetry. In some embodiments of the invention, the normal conductor layer (e.g., in junctions 60-1 and 60-2) can have a very low interface resistance with the time-reversal symmetry breaking superconductor (e.g., superconductors 10 and 20, respectively). The interface resistance preferably remains low in order to minimize quasi-particle excitation, thus minimizing decoherence factors. For example, the interface formed when Au is epitaxially deposited on YBCO can have a normal state resistance of about $10^{-6}$ $\Omega cm^2$, whereas an interface between a YBCO superconducting material and a second, conventional superconductor such as Nb, can have a much higher interface resistance of about $10^{-2}$ $\Omega cm^2$.

Methods of Fabrication

An embodiment of a method for fabricating qubit 100 shown in FIGS. 1 and 2 includes patterning a film of unconventional superconductors 10 and 20 to form a superconducting finger that includes a grain boundary junction 30, depositing a layer of an insulating material, exposing regions of the superconducting layer through the insulating material 50 as required to form at least one region on either side of the grain boundary, depositing a thin layer of a normal conductive material to act as an interface for the c-axis tunnel junctions 60-1 and 60-2, and depositing a second layer of a conventional superconductor 40, such that the conventional superconductor contacts the normal conductor material on either side of the underlying grain boundary.

Figure 3:
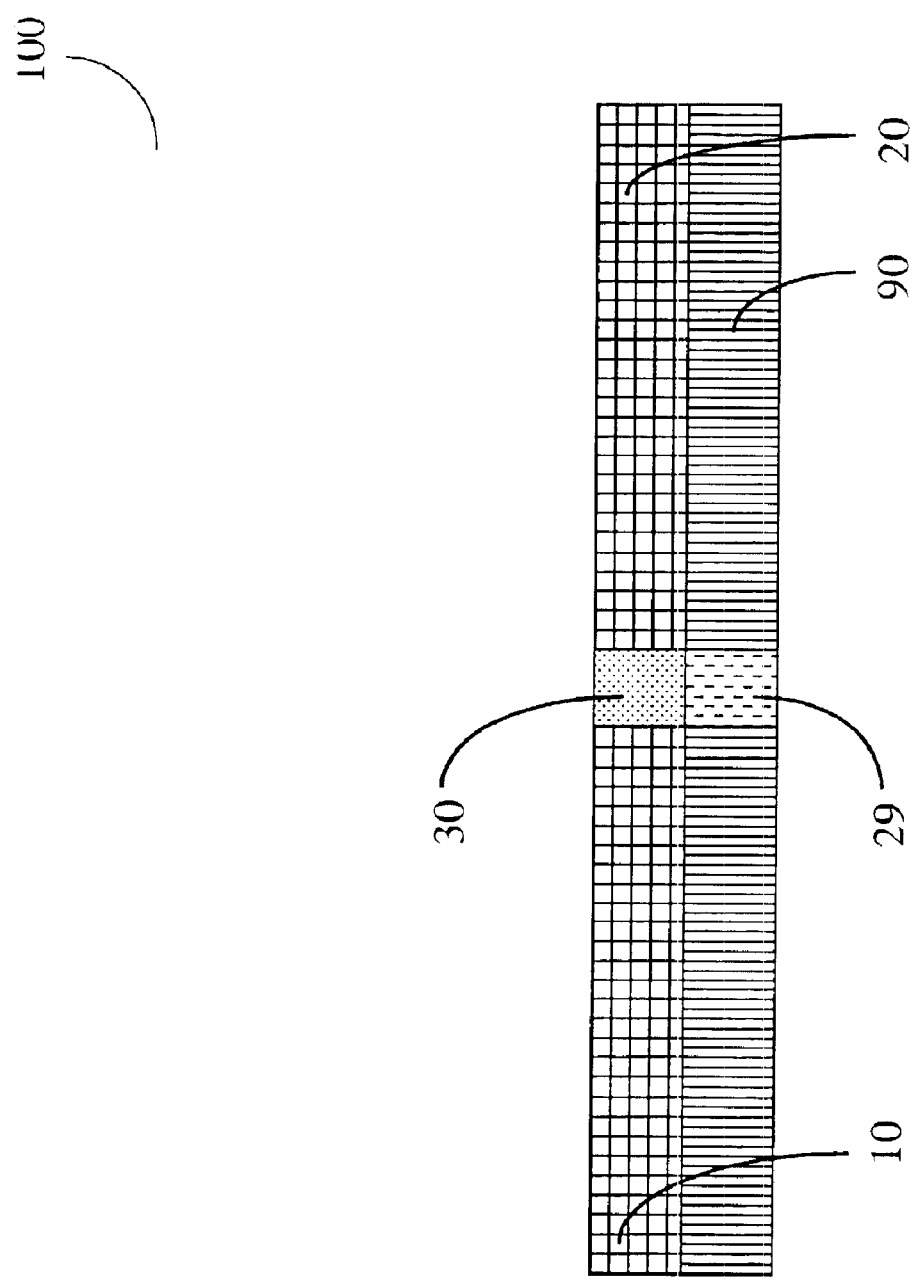
FIG. 3 illustrates a cross-sectional view of a bi-crystal substrate and a superconducting layer.
Figure 4:
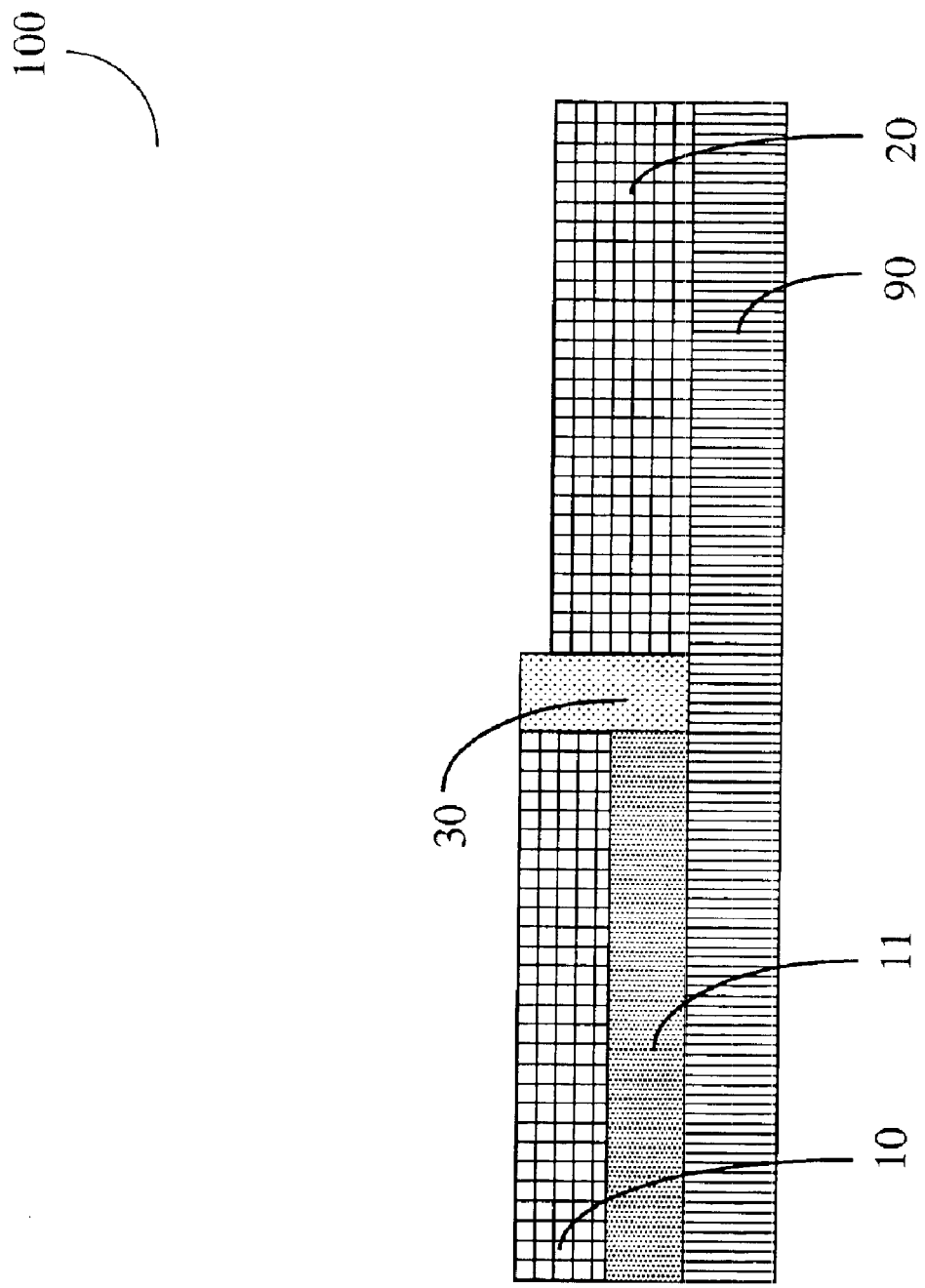
FIG. 4 illustrates a cross-sectional view of a substrate and a superconducting layer.
Figure 5:
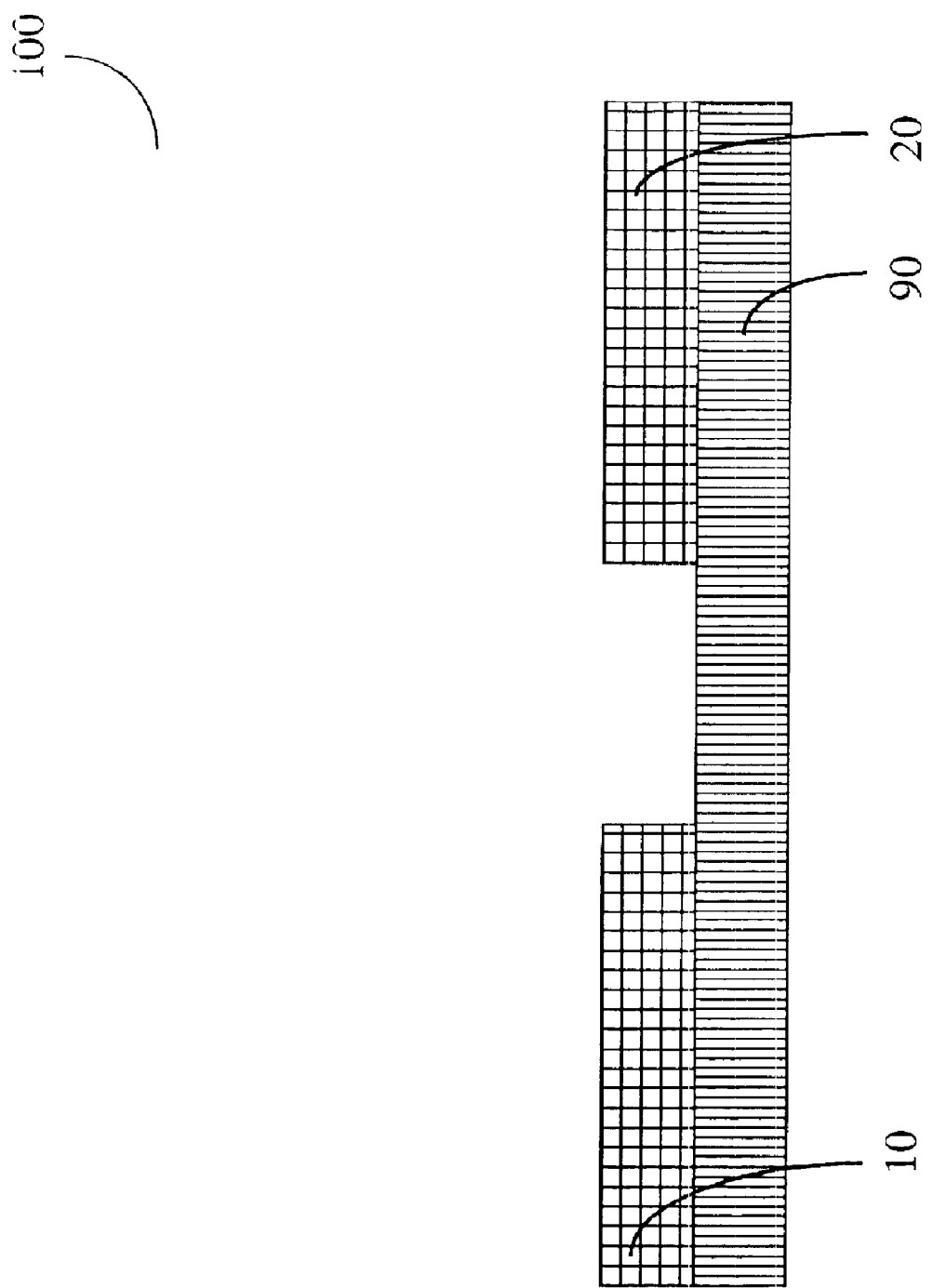
FIG. 5 illustrates a cross-sectional view of a substrate and a superconducting layer with a gap etched into the superconducting layer.

Deposition of superconducting material for superconductors 10 and 20 as illustrated in FIGS. 3, 4, and 5 is well known in the art. FIG. 3 illustrates a Josephson junction between superconductors 10 and 20, and FIG. 4 illustrates a bi-epitaxial type grain boundary junction between superconductors 10 and 20. For illustrative purposes, FIGS. 3 and 4 show grain boundary 30 in substrate 90.

Typically a bi-crystal substrate will be used for fabrication of the qubit. The bi-crystal substrate can include a grain boundary with the desired crystal lattice misorientation angle. In an embodiment of the invention, the grain boundary Josephson junction in the superconducting material regions (i.e., 10 and 20 of FIG. 2) can act as a π-junction in the qubit loop. The superconducting material can then be deposited using pulsed laser deposition techniques, for example, which are well known in the field. Standard lithography techniques, such as Ar ion-beam etching, can then be used to pattern the required structures out of the superconducting material. The superconducting materials 10 and 20 can have the same thickness, $T_{10}$ and $T_{40}$, which can be about 100 to about 300 nm. Deposition of materials through effusion e.g., epitaxy, laser and thermal deposition, and sputtering, allows for layers to be built upon the substrate. Methods for depositing superconducting materials are well known. Fabrication of submicron structures in high-$T_c$ superconducting materials are described in P. Larsson, B. Nilsson, and Z. G. Ivanov, *J. Vac. Sci. Technol. B*, 18, 25–31, (2000); P. Larsson, A. Ya, Tzalenchuk, and Z. G. Ivanov, *J. Appl. Phys.* 90, 3450, (2001), both of which are incorporated herein by reference.

In preferred embodiments of the invention, the superconducting materials 10, 20 are both superconductors having a pairing symmetry with a dominant component having a non-zero angular moment. A first superconducting layer can be a d-wave superconductor such as YBa$_2$Cu$_3$O$_{7-x}$, and can be deposited by pulsed laser deposition for example.

Another method for fabricating a first part of qubit 100 (superconducting layers 10 and 20 separated by junction 30) can include forming a grain boundary bi-epitaxially, and then following the same patterning and deposition procedures described hereinabove to create the remainder of the structure. A bi-epitaxial grain boundary can use a single crystal substrate, upon which specific seed layers 11, in FIG. 4, can be deposited. A superconducting material deposited on these seed layers will have an altered crystal lattice orientation in the areas where the substrate was seeded but will otherwise align with the substrate. For a 45° asymmetric grain boundary, the seed materials MgO, and CeO$_2$ can be used. Methods for providing bi-epitaxial grain boundaries are well known. See, e.g., S. Nicoletti, H. Moriceau, J. Villegier, D. Chateigner, B. Bourgeaux, C. Cabanel, and J. Laval, "Bi-epitaxial YBCO grain boundary Josephson junctions on SrTiO$_3$ and sapphire substrates", *Physica C*, 269, 255 (1996).

A c-axis tunnel junction (junctions 60-1 and 60-2 in FIG. 2, for example) can be formed in some embodiments according to the process illustrated in FIGS. 3 through 8. Superconducting material 10 and 20 can be deposited on a bi-crystal substrate, such that a grain boundary 30 can form in the superconducting material. Some embodiments of the invention, as discussed hereinbelow, do not include grain boundary 30. FIG. 4 illustrates an embodiment of the invention wherein a first superconducting material 10 is not coupled to a second superconducting material 20. The space between superconducting materials 10 and 20 can be removed using lithography techniques that are well known in the field. The subsequent steps in the fabrication of the structure can be the same as those described hereinabove.

Figure 6:
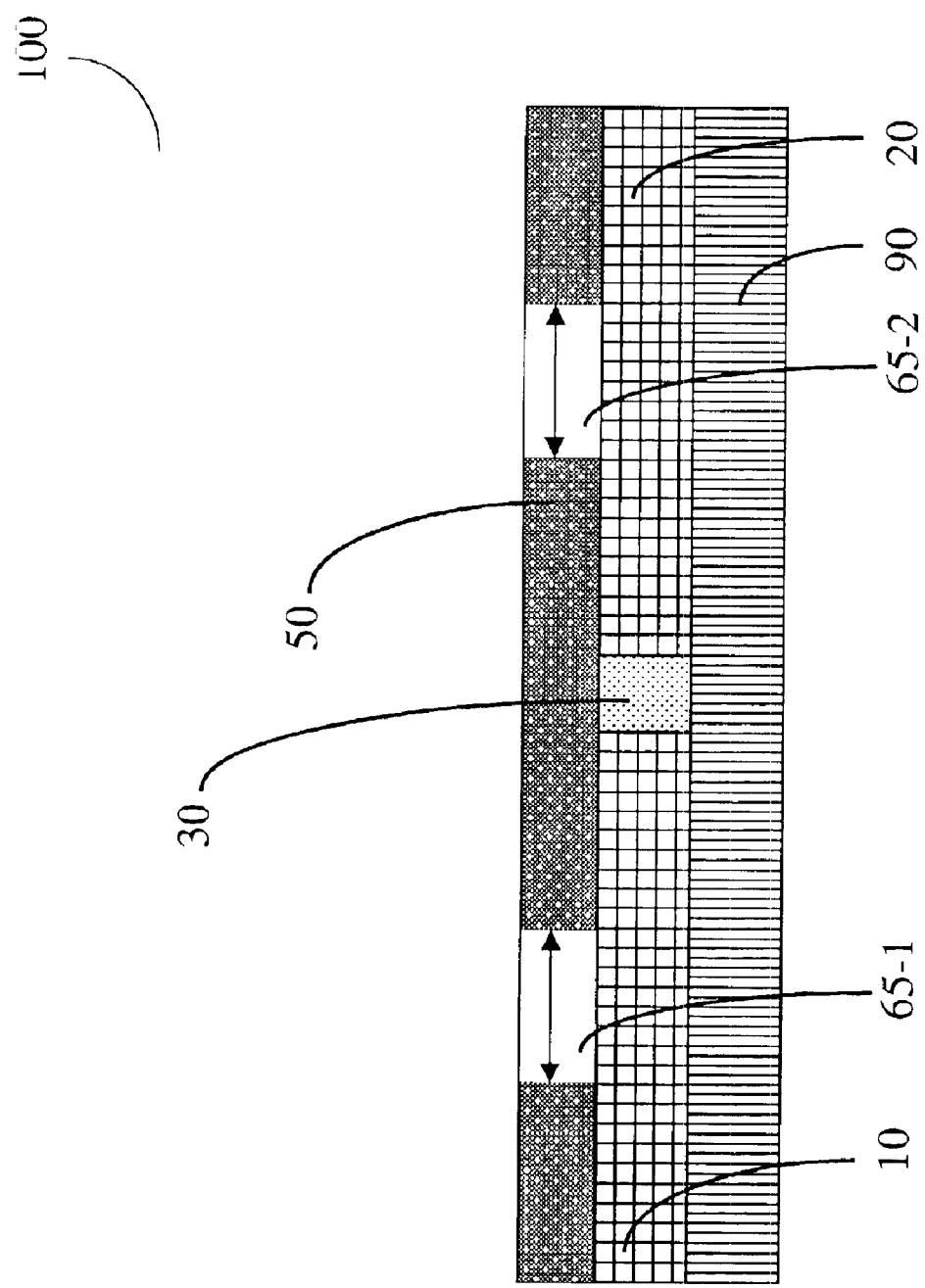
FIG. 6 illustrates a cross-sectional view of an insulating material deposited on the superconductor layer.

In a next step, as shown in FIG. 6, an insulating material 50 can be deposited over the entire sample. Materials that are useful for insulating the sample include common photoresist materials such as polymethylmethacrylate (PMMA), or other insulating materials such as aluminum oxide (Al$_2$O$_3$) and silicon dioxide (SiO$_2$) for a buffer layer between a silicon substrate and a layer of superconducting material. A region of insulating material 50 can be etched and developed to expose the underlying superconducting material 10 or 20. FIG. 6 illustrates an insulating layer 50 deposited on the surface of the sample. Regions 65-1 and 65-2 can be etched using electron beam lithography for example. The regions 65-1 and 65-2 can be on either side of the underlying grain boundary 30, and can form the positions of the c-axis tunnel junctions. In some embodiments of the invention, the regions 65-1 and 65-2 can extend over grain boundary 30. Methods for etching the insulating material are well known and the chosen insulating material 50 can depend on the embodiment of the invention. Once regions 65-1 and 65-2 have been etched, they can be developed in a chemical solution for removal. Methods for lithography are well known and which are used can depend on a particular embodiment of the invention.

Figure 7:
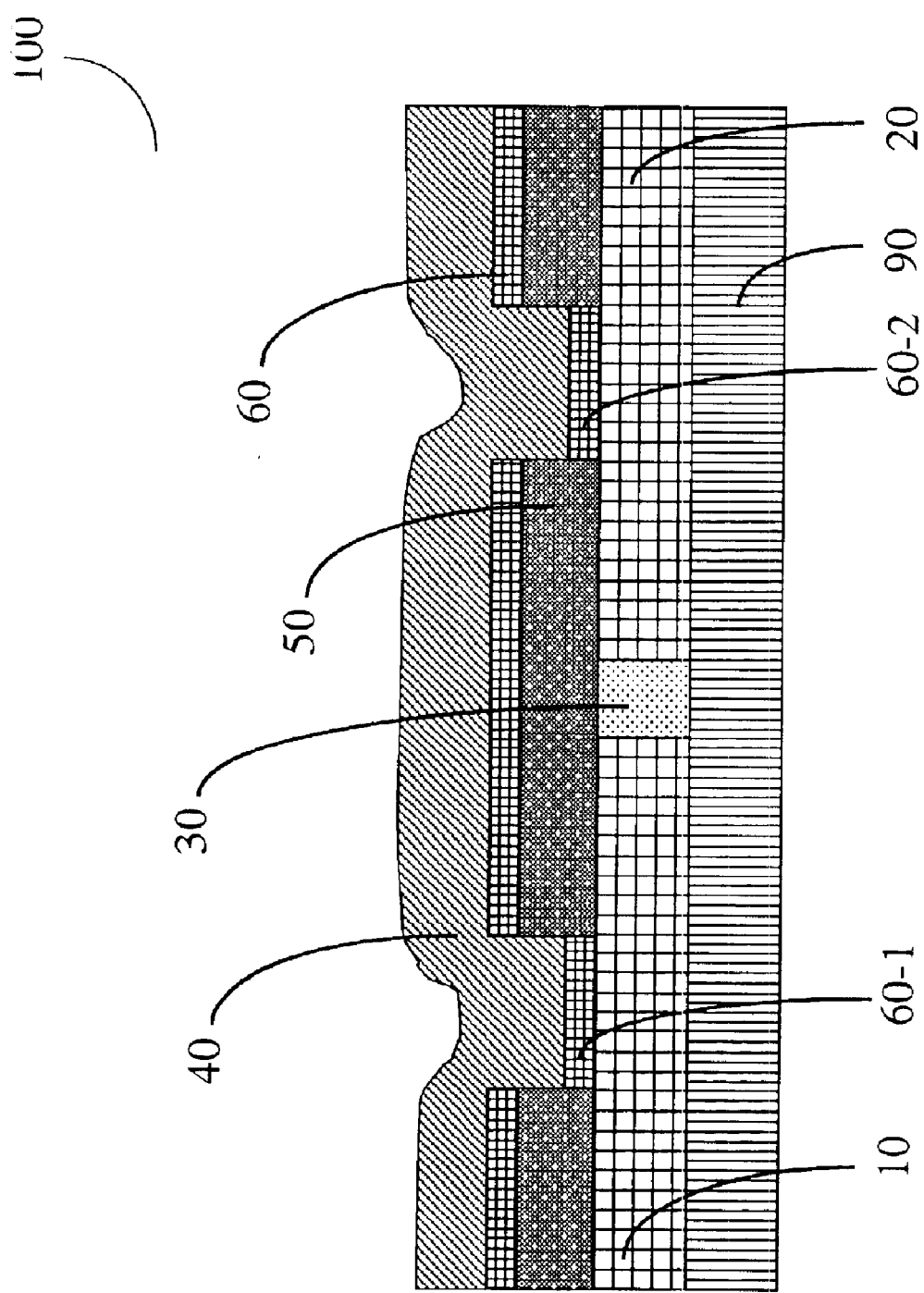
FIG. 7 illustrates a cross-sectional view of a normal conductive material and a superconductor material further deposited on the sample.
Figure 8:
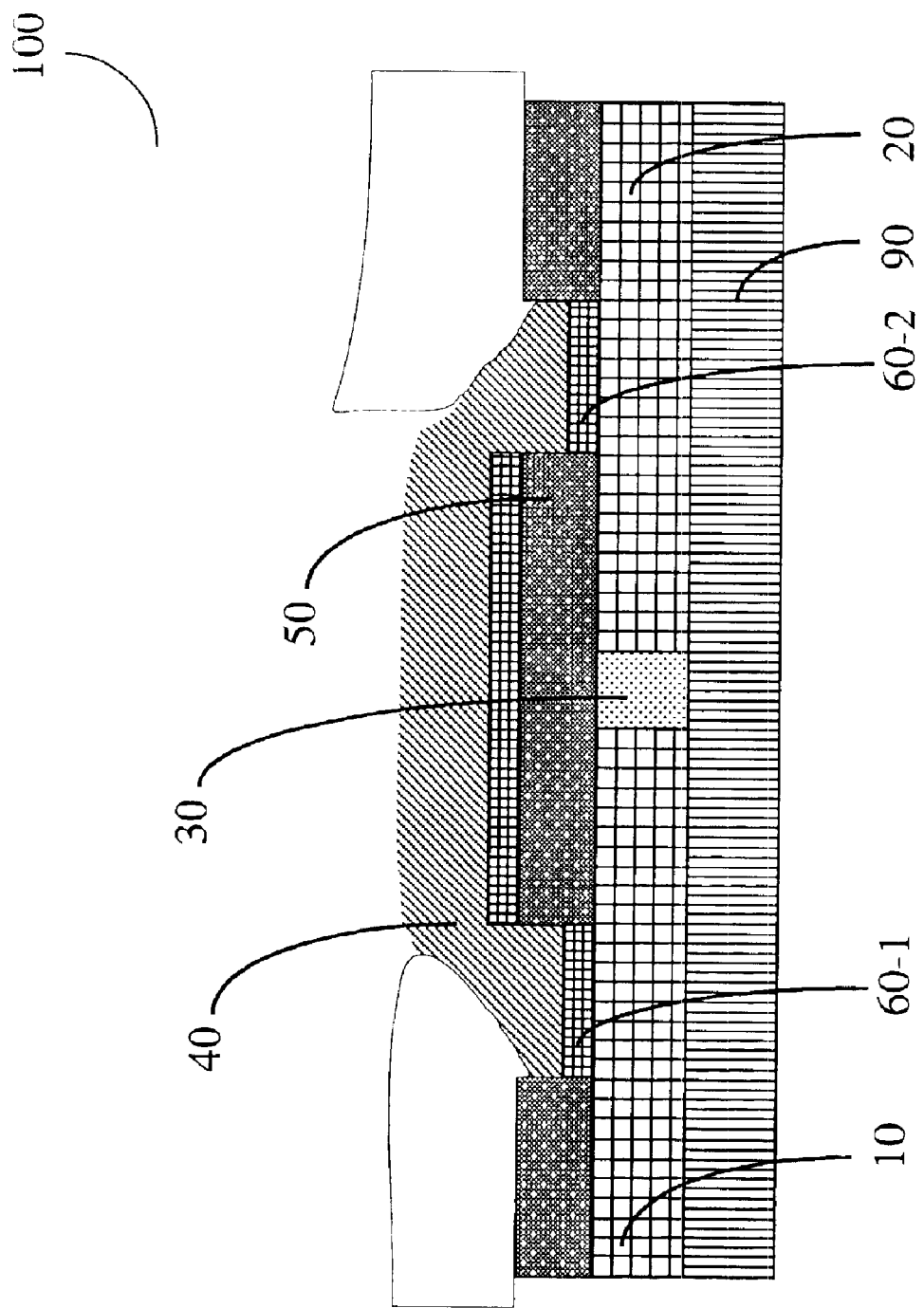
FIG. 8 illustrates a cross-sectional view of an embodiment of the invention.

Once regions 65-1 and 65-2 have been removed, a normal conductive material 60 can be deposited over the entire sample, followed by a conventional superconducting material 40 as illustrated in FIG. 7. Methods for deposition of these materials are well known in the art. In a final fabrication step, the normal conductor 60 and conventional superconducting material 40 can be removed in some areas. The removal of the material from some regions of the sample is illustrated in FIG. 8. The materials 40 and 60 can be removed using standard techniques of lithography, which are well known to one of ordinary in the skill in the art.

Applications of a SLIQ

In conjunction with a system and method for initializing, evolving, and performing readout operations on its state, SLIQ 100 can be used in a quantum register. Initializing qubit 100 can include preparing the state of the qubit in a first basis state or a second basis state. In an embodiment of the invention, SLIQ 100 can have a first basis state represented by current circulating in the qubit loop in a first direction, and a second basis state represented by current circulating in the qubit loop in a second direction. Evolving the state of qubit 100 can include decoupling qubit 100 from its environment. This allows qubit 100 to evolve quantum mechanically as a superposition of its basis states, at a rate that is determined by the tunneling amplitude of the qubit system. Finally, a readout operation can be performed on qubit 100 by determining the direction of the circulating current in the qubit loop. When the readout is performed, the state of qubit 100 collapses into one of the basis states which is then measured. As described in detail in U.S. patent application Ser. No. 09/872,495, cross-referenced hereinabove, a method for performing a readout operation includes grounding the structure, biasing the structure, and measuring a potential drop.

For a qubit system 100 of FIGS. 1 and 2, a method for initializing a first state of qubit system 100 can include passing a bias current through superconducting material 10 and 20 respectively. Furthermore, a method for initializing a second state of qubit system 100 can include passing a bias current in the opposite direction to the previously described initialization method. A mechanism for biasing the structure includes driving current through at least one of the first, second, or third regions of the loop. For example, current can be driven through the superconducting material 40. Driving a current includes providing a current source, and connecting the current source to a region of superconducting material such that current can be induced in a preferred direction, for example clockwise or counterclockwise. Embodiments of the present invention can bias the state of the loop by driving a clockwise current in a part of the loop.

In another embodiment of the present invention, a method for initializing the state of qubit 100 can include applying a bias current asymmetrically through a part of the qubit loop. This will bias the basis state of the qubit that coincides with the respective direction of bias current. For example, if the bias current is applied through from superconducting material 10 to superconducting material 20, then a counter-clockwise current circulation in the qubit loop is formed, and the basis state associated with counter-clockwise current circulation in the qubit loop will be initialized. Such an initialization method can be used when qubit 100 is grounded, wherein the state of the qubit is fixed in one of its basis states and cannot evolve quantum mechanically. Grounding of qubit 100 can be achieved by coupling qubit 100 to for example a bulk superconductor. A bulk superconductor is not a mesoscopic structure and is often referred to as a reservoir. The bulk superconductor, or any other material that acts as a ground, can have a constant phase, and represents an infinite source of charge, such that when qubit 100 is coupled to the ground, quantum behavior of qubit 100 disappears. Any grounding mechanism is preferably should be controllable, so that the ground can be switched on and off as required for various other operations to be performed.

After a period of time that will depend on the embodiment of the invention, the bias current can be removed, and qubit 100 will be in the appropriate state. Qubit 100 will remain in the initialized state until the ground has been removed, at which point quantum evolution of the qubit state will occur.

In accordance with an embodiment of the present invention, a method for measuring the state of a qubit includes grounding the quantum state of the qubit and providing a mechanism for determining the direction of current in the qubit loop. In some embodiments of the present invention, a mechanism for determining the direction of current in the qubit loop includes current-biasing the loop and measuring a potential drop. A current-bias includes biasing current through at least one of the regions of the qubit loop. Referring to FIG. 2, current can be biased across regions 10 and 20, 10 and 40, or 40 and 20 for example. The result of measuring a potential drop determines the direction of the supercurrent circulating in the loop. In some embodiments of the present invention, measuring a potential drop will result in measurement of voltage, which is correlated with a first state, and measurement of a zero voltage, which is correlated with a second state. Details of such measurement schemes are described in detail in U.S. patent Ser. No. 09/872,495, incorporated herein by reference.

Figure 9:
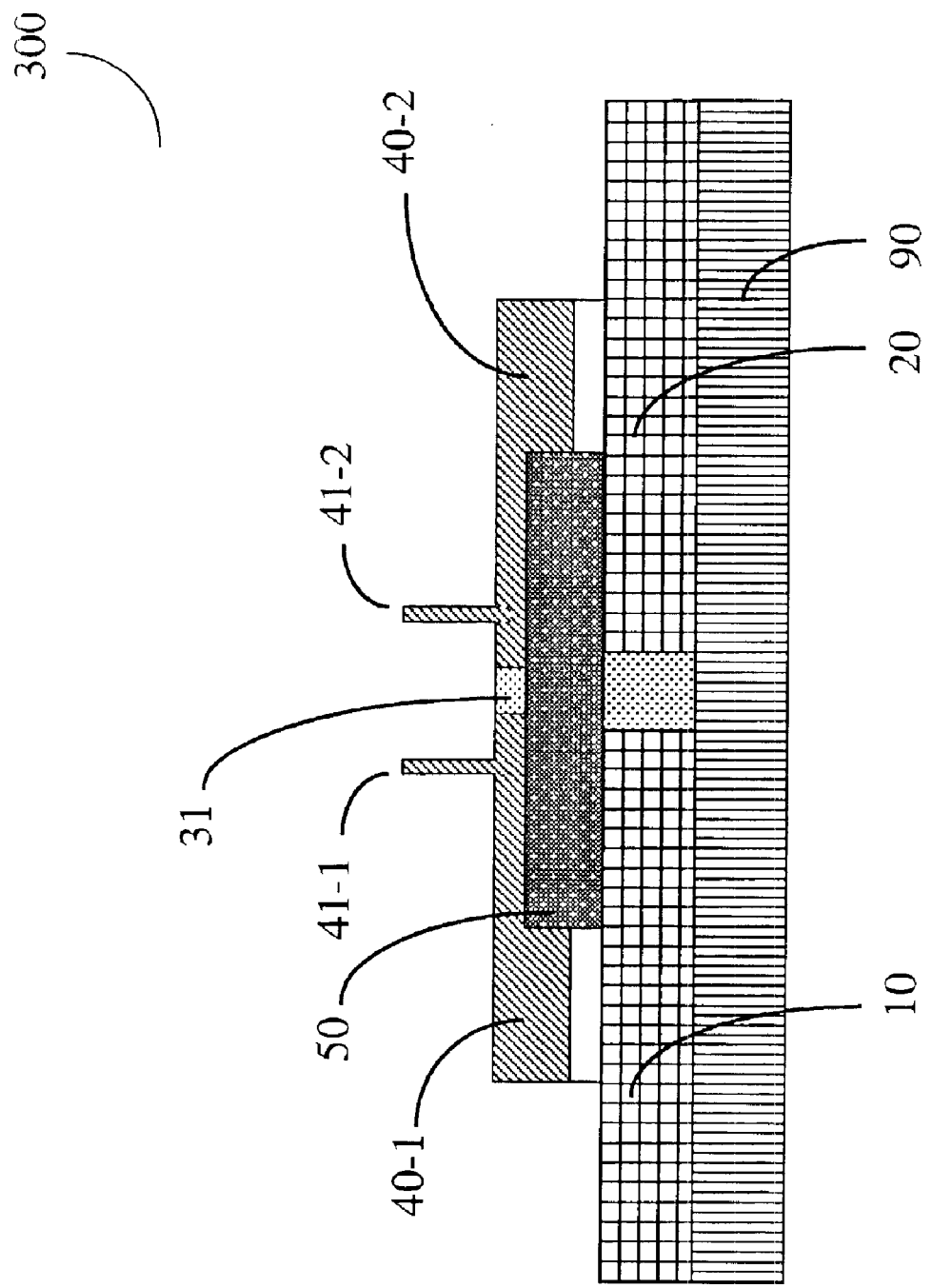
FIG. 9 illustrates a cross-sectional view of another embodiment of a superconducting low inductance qubit according to the present invention.

FIG. 9 illustrates another embodiment of the invention, qubit system 300, that includes two terminals 41-1 and 41-2, and another Josephson junction 31 breaking a second portion of the qubit loop into two components 40-1 and 40-2 respectively. Terminals 41-1 and 41-2 allow initialization and readout of the state of qubit system 300. A method for initializing a first state of qubit system 300 can include grounding the system, and applying a biasing current between terminals 41-1 and 41-2 for a time that is dependent upon the tunneling amplitude of the embodiment of the invention, thus initializing the current in the loop to a clockwise circulation in the qubit loop. Alternatively, a method for initializing a second state of the qubit system 300 can include grounding the system, and applying a biasing current between terminals 41-2 and 41-1 for a time that is dependent upon the tunneling amplitude of the embodiment of the invention, thus initializing a counter-clockwise current circulation in the qubit loop. When the grounding influence is removed, the qubit system 300 can then evolve from the initialized basis state quantum mechanically. Qubit system 300 will evolve in a known way, at a rate which corresponds with the tunneling amplitude of the system. The tunneling amplitude of the system can depend upon the embodiment of the invention.

Methods for performing a readout operation on the state of the qubit of FIG. 9 include current-biasing leads 41-1 and 41-2 and measuring a potential difference between the leads. The direction of current-bias will correlate with a direction of circulating current in the qubit 300. In operation, if the qubit collapses to a direction of supercurrent that correlates with the direction of the current-bias, then a first response will be measured, whereas if the qubit collapses to a direction of supercurrent that anti-correlates with the direction of the current-bias, then a second response will be measured. For instance, if the qubit has a double well potential and the qubit is biased such that degeneracy of bit states no longer exists then the state of the qubit can be determined from the first and second responses. Each of the first and second responses is correlated with the respective state of the qubit. In some embodiments of the present invention, the first response includes measurement of a voltage and the second response includes a measurement of no voltage. In some embodiments of the present invention, the first and second responses correlate with differentiable potential differences. See U.S. application Ser. No. 09/872,495, entitled "Quantum Processing System and Method for a Superconducting Phase Qubit", filed Jun. 1$^{st}$, 2001.

An embodiment of a first and a second measurement response is comprised of the observation of a voltage or its absence. The use of the presence or absence of a voltage as a first and second measurement response is described in U.S. application Ser. No. 09/839,637 entitled "An Intrinsic Phase Shifter Quantum Bit with a Multi-Terminal Junction and Loop" filed Apr. 20$^{th}$, 2001.

An alternative readout method is described in commonly assigned U.S. application Ser. No. 09/839,637, entitled "An Intrinsic Phase Shifter Quantum Bit with a Multi-Terminal Junction and Loop" filed Apr. 20, 2001, which is incorporated herein by reference. In general terms, because the critical current in the junction depends on the state of the qubit, a read operation can be performed by applying a current asymmetrically across the junction, with a magnitude between the critical currents of the two states and determining if a resistance is created.

In more specific terms, a read operation on a qubit can be accomplished based on the fact that each of the two degenerate states of the qubit exhibits a unique current-voltage curve with respect to current flowing between the two terminals. Each of the two degenerate states gives rise to a different critical current in the junction. In any Josephson junction, if the critical current $I_C$ is exceeded, dynamical effects result and a resistance becomes present in the junction. Therefore, determining which of the two critical currents is appropriate for the junction differentiates between the two degenerate states of the quantum system. A digital readout from a qubit is especially preferred because it is robust, i.e., immune to the introduction of noise in the amplification of the signal. A qubit whose states correspond to absence and presence of a voltage, respectively, gives a digital readout and thus is preferred.

The quantum state of the qubit can, for example, be read by a controller passing a transport current $I_T$ through the junction (for example between the two terminals). The critical current $I_C$ of the junction is dependent on the quantum state of the qubit, with one state corresponding to a lower value of critical current in the junction, and the opposite state corresponding to a higher value of critical current. The upper and lower values of the critical current $I_C$ is dependent upon the particular embodiment of the qubit. Thus, determining the state of qubit 100 can be accomplished by discerning the value of the critical current $I_C$ in the junction. In one method of measuring the quantum state of the qubit, the controller applies to the junction a transport current $I_T$ which is between the known upper and lower critical current values (i.e., between the values of the critical current $I_C$ for each of the quantum states). When the transport current $I_T$ is applied, if the system occupies the state associated with the lower critical current, then the transport current will have exceeded the critical current value of the junction, thus resulting in a junction resistance, and a corresponding voltage across the terminals. Alternatively, if the system occupies the high critical current state, no voltage across the terminals will result.

Another embodiment of a readout operation includes removing the degeneracy of a qubit so that one basis state is energetically favorable over the other. Consider the example of a readout operation where the state of the qubit is in the upper well, which is a local minimum. When the biasing current exceeds a critical value then the state of the qubit would escape the local minimum of the higher energy well and come to rest in the lower energy well. This transition would result in a finite voltage across a Josephson junction of the loop or flux in the loop. If the state of the qubit were already in the lower energy state no voltage or flux would be observed. The states of a biased Josephson junction are well known in art, see e.g., K. K. Likharev, *Dynamics of Josephson Junctions and Circuits*, Gordon & Breach Science Publishers, New York, (1986), which is hereby incorporated by reference in its entirety.

An additional embodiment of a readout method is to bias a structure like 300 depicted in FIG. 3. Embodiments of the present invention include the use of clockwise $I_{CW}$ and counterclockwise current $I_{CCW}$ as the bit states of a qubit, i.e., wherein currents $I_{CCW}$ and $I_{CW}$ flow in opposite directions when viewed along a common axis. Providing a readout current across a Josephson junction of a superconducting structure like 300 or 100 can effect a readout scheme. Embodiments of the present invention include a superconducting structure where the Josephson junction 31 has the smallest critical current $I_{31}$ of the Josephson junctions that comprise the loop. The superconducting structure 300 has a readout current applied via leads 41-1 and 41-2 so that a readout current IR traverses Josephson junction 31. If the level of readout supercurrent is chosen such that $I_R+I_{CW}$ is about equal to, or exceeds, the critical current of the Josephson junction 31, $I_{31}$, then the presence of a voltage across Josephson junction 31 is a measurement of clockwise current which corresponds to a bit state of the qubit. Alternatively, if the current through Josephson junction 31 is $I_R+I_{CCW}$, no voltage would be observed on the Josephson junction 31, i.e., the current in each direction is of equal magnitude, $(I_R+I_{CCW}=I_R-I_{CW})$ and is less than $I_{31}$. The observation of no voltage would indicate a counter clockwise current corresponding to a bit state of the qubit. This scheme is robust because the readout signal from the qubit is digitized.

In some embodiments of the present invention, a method for implementing a single-qubit bias operation includes biasing the loop for a time $t_b$, such that a phase is accumulated preferentially on one basis state of the quantum state of the loop. A basis state of the quantum state of the loop forms a basis state for the qubit. In operation, the isolated loop has supercurrent circulating in a first and second direction, each of which correlates with a first and second basis state respectively. Biasing a first or second direction correspondingly biases a first or second basis state respectively. In accordance with an embodiment of the present invention, a method for applying a single-qubit bias operation includes biasing at least one region of the loop for a time $t_b$. Biasing a region of the loop can include driving a current through at least one region of the loop. The time $t_b$ depends on the embodiment of the invention and correlates with the tunneling amplitude of the loop. In some embodiments of the present invention, the time $t_b$ is about 0.1 nanoseconds (ns). In some embodiments of the present invention, the magnitude of current is less than the critical current of the respective Josephson junctions affected by the bias current.

Referring to FIG. 9, in some embodiments of the present invention, a method for applying a single-qubit bias operation includes current-biasing leads 41-1 and 41-2 for a time $t_b$. The bias current can have a magnitude less than the critical current of Josephson junction 31. In some embodiments of the present invention, the bias current can have a magnitude less than about 10 nano-Amperes (nA).

A qubit system can include a plurality of qubits such as qubit 100 or qubit 300, wherein each qubit can be individually controlled for initialization, evolution, and readout operations. Such a qubit system is all that is theoretically required for carrying out applications of universal quantum computing, such as Grover's algorithm, generating random numbers, or for performing database searches. General principles of carrying out quantum computing are described in A. Barenco et al., "Elementary Quantum Gates for Quantum Computation", *Physical Review A*, 52:3457, (1995), incorporated herein by reference.

In order to entangle qubits, the wavefunctions of the qubits to be entangled are allowed to overlap, such that each of the qubits contains information about the qubits with which it is entangled. Physically, entanglement of qubits requires a controllable coupling, such that the qubits can be coupled or de-coupled during quantum computation.

A system for entangling qubits can include a qubit system that includes at least two qubits, and a mechanism for controllably coupling the qubits in the qubit system. In an embodiment of the invention, a qubit system can include at least two SLIQ structures on a chip, and a structure that couple adjacent SLIQ structures. A structure for coupling adjacent qubits can include a direct link between the qubits, and a mechanism for opening and closing that link. A mechanism for controlling the coupling between qubits can include a switch, such as a single electron transistor (SET) or a parity key. Operation and fabrication of the SET is well known. See, e.g., P. Joyez et al., "Observation of Parity-Induced Suppression of Josephson Tunneling in the Superconducting Single Electron Transistor", *Phys. Rev. Lett.*, 72, 15 (1994), incorporated herein by reference in its entirety. The coupling switch between the qubits must act coherently, such that Cooper pairs can flow without interference.

Figure 10:
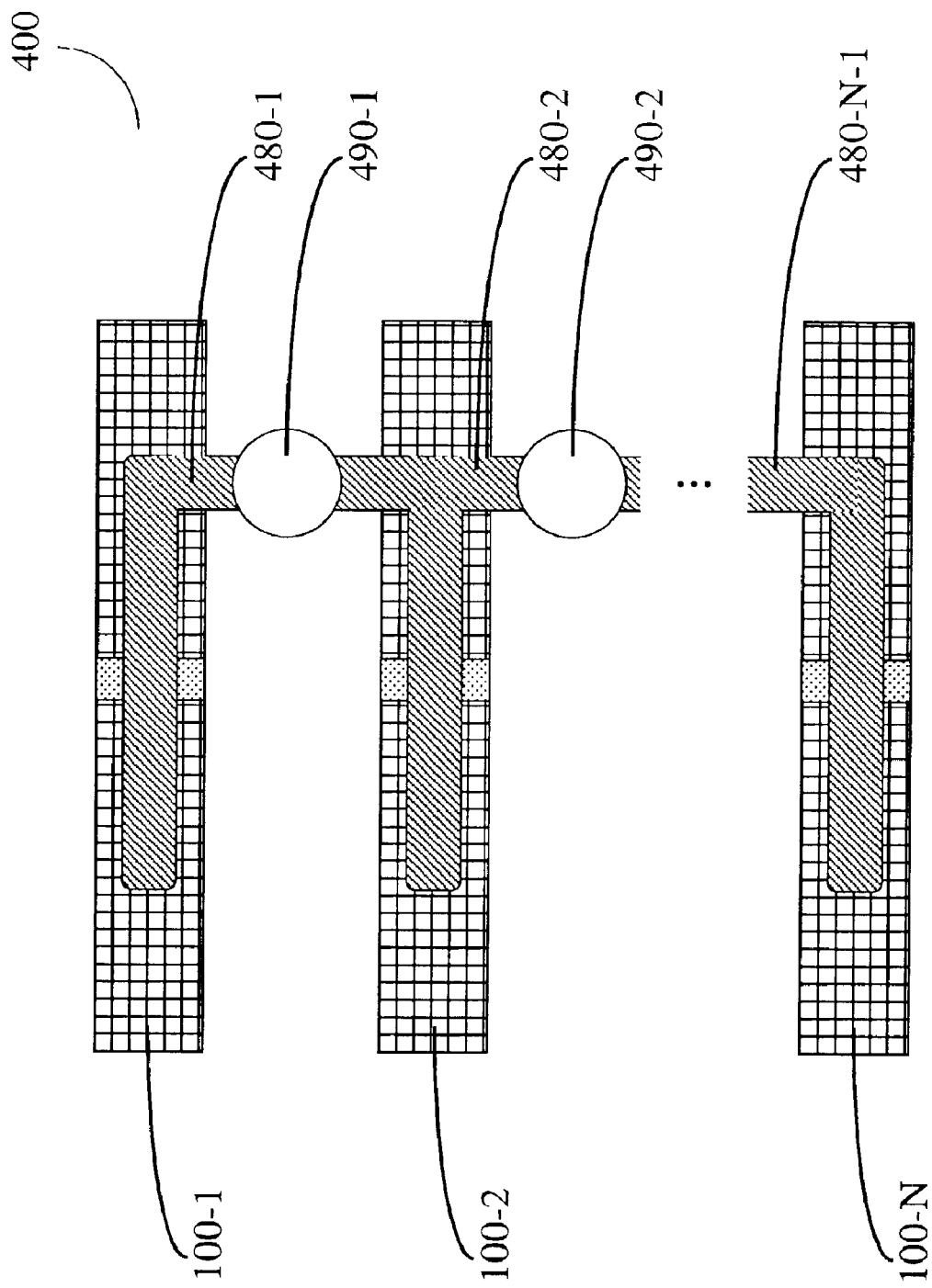
FIG. 10 illustrates a plan view of a plurality of a superconducting low inductance qubits according to the present invention, with a mechanism for coupling adjacent devices.

FIG. 10 illustrates a cross sectional view of a qubit system 400, that includes a plurality of qubits 100-1 through 100-N, a plurality of coupling branches 480-1 through 480-(N-1), and a plurality of controllable coupling switches 490-1 through 490-N respectively. During a computation, the switches 490-1 through 490-N can be controlled to modulate coupling of adjacent pairs of qubits 100-1 through 100-N. When one of switches 490-1 through 490-N is closed, persistent current in the coupled qubits can be exchanged coherently through branches 480-1 through 480-(N-1) respectively. This mixes the energy of the qubit loops that are coupled and entangles their states. When one of switches 490-1 through 490-N is opened, the qubit loops are de-coupled and no current is permitted to pass between the qubit loops.

A method for quantum computing on system 400, then, can include operations that can generally be applied to qubits and are advantageously applied to the superconducting low inductance qubits of the present invention. Such operations include: initializing the state of qubit system 400, evolving qubit system 400, and reading out the state of qubit system 400. Qubit system 400 can include a plurality of qubits, qubits 100-1 through 100-N, and can further include coupling mechanisms such as switches 490-1 through 490-N-1 between pairs of qubits 100-1 through 100-N. Evolution of qubits 100-1 through 100-N can include modulating the coupling mechanisms between respective qubits in order to entangle their states. Readout of the state of the qubit system can include readout of the state of each of qubits 100-1 through 100-N in sequence or in parallel, as required by the algorithm being implemented. For example, a method for quantum computing using the qubit system 400 of FIG. 4 can include initialization of qubits 100-1 through 100-N respectively in sequence or in parallel, isolating each of qubits 100-1 through 100-N to enable quantum evolution, controlled coupling of at least some of qubits 100-1 through 100-N, coupling of qubit system 400 to a grounding mechanism, and readout of the state of qubit system 400.

In accordance with some embodiments of the present invention, qubit system 400 can act as a quantum register, wherein a quantum register can store, evolve, and readout the state of qubits 100-1 through 100-N in the register. Furthermore, a quantum register can include a coupling mechanism for entangling qubits in the register. The quantum register can be used to solve quantum algorithms. An external control system can control the quantum register by controlling the initialization, evolution, coupling, or readout, or any other function that the quantum register must perform.

Figure 11:
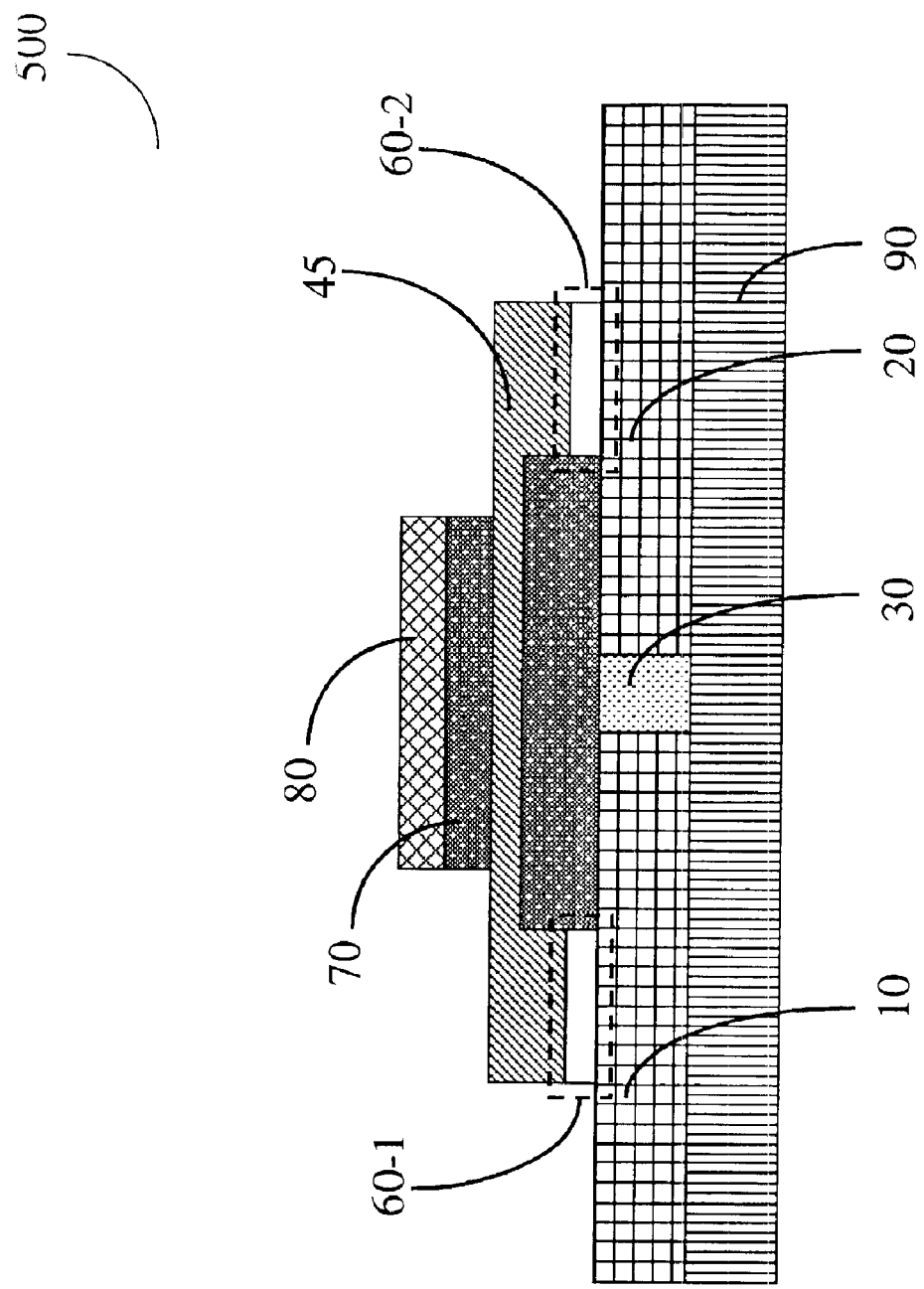
FIG. 11 shows a cross-sectional view of an embodiment of a superconducting low inductance qubit with an external electrode.

FIG. 11 illustrates the addition of an electrode 80 to the structure of a qubit 500. Electrode 80 is isolated from the main structure by an insulating material 70. In operation, application of a voltage to electrode 80 can influence the characteristics of the qubit 500 by controlling the charge on superconductor 45. For application as a qubit, control of the voltage on electrode 80 can allow for modulation of the potential energy barrier separating the degenerate states of the system. Correspondingly, this enables control of the tunneling frequency of the system. During quantum computation, this is equivalent to a $\sigma_x$ gate operation.

The second part of the loop, superconductor 45, and electrode 80 can have applications for a variety of different structures. For example, structure 500 can be used to coherently couple two superconductors that violate time reversal symmetry. Such a device can be similar to a single electron transistor (SET), wherein a voltage is coupled to a superconducting island, isolated between at least two Josephson junctions. Changes in the voltage correlate with the charge on the island, changing the ratio between the Coulomb energy and the Josephson energy such that the island permits the charge of a single electron to pass. Furthermore, in some cases the SET can be tuned by varying the charge of the island to permit the charge of a single Cooper pair to pass. If the Josephson junctions that isolate the island do not introduce a phase to the Cooper pair as it passes through the device, then the SET can be considered coherent. The c-axis heterostructure junctions in the SLIQ structure are coherent tunnel junctions that allow the passing of supercurrent between an unconventional superconductor and a conventional superconductor. The second part of the loop is isolated by the two c-axis tunnel junctions, and thus is an island, and the electrode provides a mechanism for capacitively coupling a voltage to the island, thus providing a mechanism for controlling the charge of the island. Thus, such a structure can become a coherent Cooper pair transistor, or generally a mechanism for controlled coupling of two unconventional superconductors.

For operation as a qubit, the system is preferably at a temperature low enough to sufficiently suppress decoherence due to thermal excitations. Some embodiments of the invention can run at a temperature of about 1K. During quantum computation, the voltage applied to the electrode preferably has a magnitude that correlates with the barrier height between the degenerate states of the system. For use in quantum operations, the voltage applied to the electrode is preferably on the order of a few mV. At higher temperatures, where thermal excitations suppress quantum effects, qubit 500 of FIG. 11 can be used in the same manner in the classical regime as a variable Josephson junction. Modulation of the voltage on electrode 80 can provide a mechanism for controlling the ground state phase drop across the junction 30, thus resulting in a variable phase shift Josephson junction.

Figure 12:
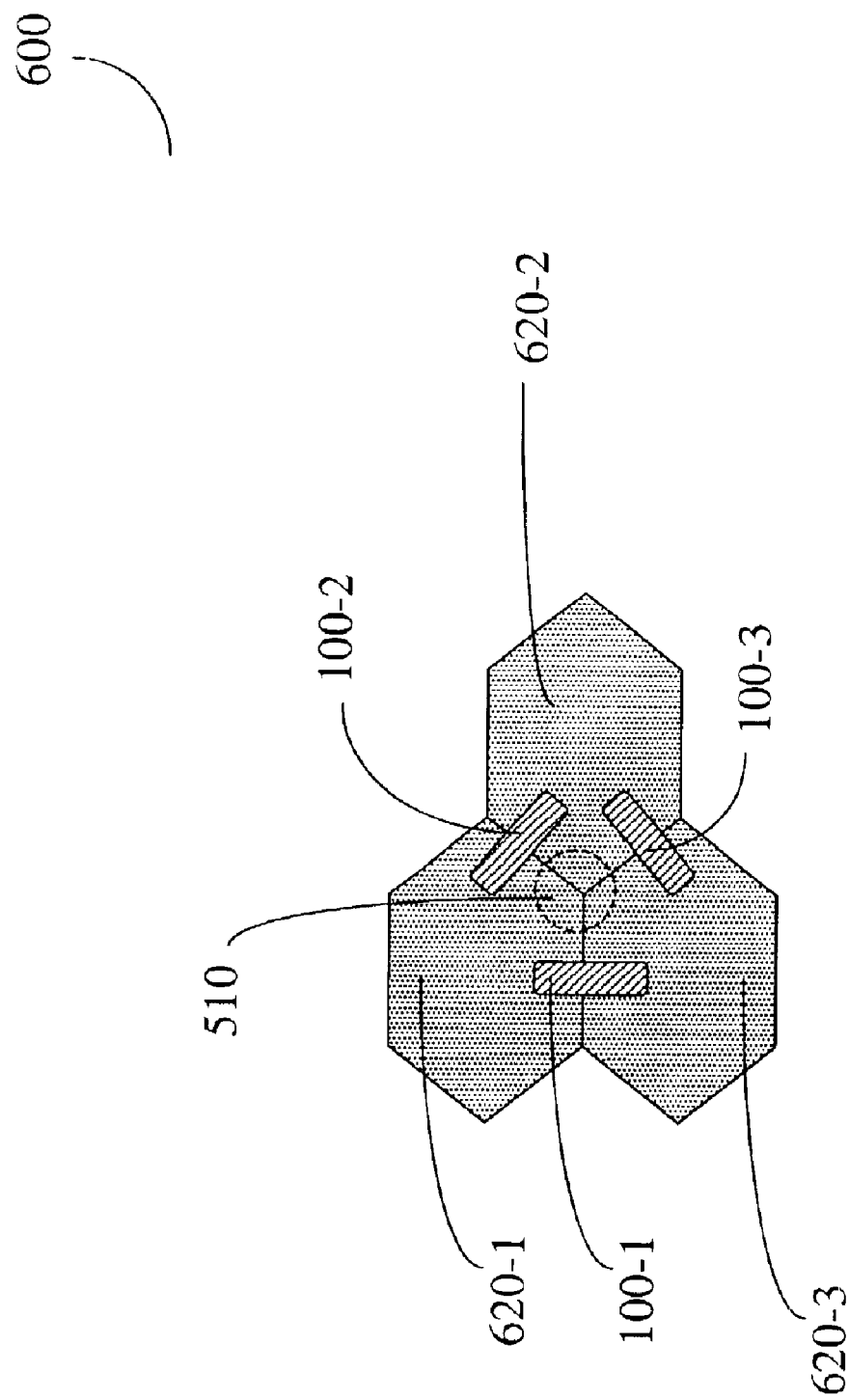
FIG. 12 shows a polygonal arrangement of coupled permanent readout superconducting qubits according to the present invention.

FIG. 12 illustrates a plan view of a polygon crystal system 600. The crystal materials 620-1, 620-2, and 620-3 can individually be superconducting materials having different crystal alignments. Region 510 illustrates a region wherein flux can be trapped when the crystal alignment of the plates has some optimal configuration. FIG. 6 further illustrates an embodiment of structures 100-1 through 100-3 respectively, that can be used to interact and control the flux trapped in the intersection region 510. In an embodiment of the invention a current can be applied across the structures 100-1 through 100-3 that can modulate the phase difference across the grain boundary spanned by the structures. In this way, trapped flux at the intersection point can be created, removed, or otherwise manipulated by modulating the bias currents on the structures 100-1 through 100-3 respectively. Furthermore, structures 100-1 through 100-3 can be used to trap flux at intersections that do not inherently exhibit flux trapping, thus increasing the scalability and efficiency of the structure. Structures 100-1 through 100-3 can be any of the structures described with FIGS. 1, 2, 9–11.

An embodiment of a method for fabricating a flux trapping structure can include providing a crystal network chip, wherein the crystal can be a superconducting material that violates time reversal symmetry, depositing an insulating layer over the chip, removing parts of the insulating layer in regions that are adjacent to a grain boundary, depositing a normal conducting layer in region removed from the insulating layer, and further depositing a conventional superconducting material to couple normal conducting regions across a grain boundary. An embodiment of a method for using the flux trapping structure can include a mechanism for tuning the trapped flux at the intersection point. A mechanism for tuning the trapped flux can include manipulating a bias current on at least one of the current loops. For example, a bias current can be applied across at least one of 100-1, 100-2, or 100-3, such that flux trapping can occur at the intersection point between the crystals.

Although the invention has been described with reference to particular embodiments, the description is understood to provide examples of the application of the invention and should not be taken as limiting. Various adaptations and combinations of features of the embodiments disclosed are within the scope of the invention as defined by the following claims.

What is claimed is:

1. A superconducting structure comprised of:
  a first unconventional superconducting material;
  a second unconventional superconducting material;
  a first Josephson junction between the first and second unconventional superconducting materials;
  a third superconducting material that overlies a part of the first and a part of the second unconventional superconducting materials wherein:
  the third superconducting material is coupled to the first unconventional superconducting material by a second Josephson junction and the second unconventional superconducting material by a third Josephson junction, wherein the second and third Josephson junctions are coherent and are separated by an intermediate layer; and
  an insulating material separating the first and second unconventional superconducting materials from the third superconducting material, wherein flux can be stored.

2. The superconducting structure of claim 1, wherein the unconventional superconducting materials comprise a material that violates time reversal symmetry.

3. The superconducting structure of claim 1, wherein the unconventional superconducting materials further comprise a material with a non-zero angular momentum pairing of Cooper pairs.

4. The superconducting structure of claim 1, wherein any one of the first or second unconventional superconducting materials is selected from the group consisting of d-wave material and p-wave material.

5. The superconducting structure of claim 4, wherein any one of the unconventional superconducting materials is selected from the group consisting of: $YBa_2Cu_3O_{7-x}$, $Bi_2Sr_2Ca_{n-1}Cu_nO_{2n+4}$, $Tl_2Ba_2CuO_{6+x}$, $HgBa_2CuO_4$, $Sr_2RuO_4$, and $CeIrIn_5$.

6. The superconducting structure of claim 1, wherein the first Josephson junction supports a bistable state of supercurrent in its vicinity.

7. The superconducting structure of claim 6, wherein the first Josephson junction has a state phase shift of about $\pi$ radians.

8. The superconducting structure of claim 1, wherein the first Josephson junction is selected from the group consisting of bi-crystal and biepitaxial grain boundary Josephson junctions.

9. The superconducting structure of claim 8, wherein the first Josephson junction is selected from the group consisting of [0011]-tilt, [100]-tilt, and [010]-twist grain boundary Josephson junctions.

10. The superconducting structure of claim 9, wherein a misorientation angle of the first and second unconventional superconducting materials can assume any angle with respect to the grain boundary.

11. The superconducting structure of claim 10, wherein the Disorientation angles are selected from the group consisting of asymmetric and symmetric angle pairs.

12. The superconducting structure of claim 11, wherein the misorientation angles is selected from the group consisting of 0°-22.5°, 0°-30°, 0°-0°-40°, and 0°-45°.

13. The superconducting structure of claim 11, wherein the misorientation angles is selected from the group consisting of 15°-15°, 20°-20°, and 22.5°-22.5°.

14. The superconducting structure of claim 1, wherein the third superconducting material is comprised of a conventional superconducting material.

15. The superconducting structure of claim 14, wherein the third superconducting material is comprised of an s-wave material.

16. The superconducting structure of claim 1, wherein the third superconducting material comprises a Type I superconducting metal.

17. The superconducting structure of claim 14, wherein the third superconducting material is selected from the group consisting of niobium, lead, and aluminum.

18. The superconducting structure of claim 1, wherein the second and third Josephson junctions are tunnel Josephson junctions.

19. The superconducting structure of claim 18, wherein the intermediate material layer comprises an insulating material.

20. The superconducting structure of claim 19, wherein the insulating material is selected from the group consisting of aluminum oxide, and silicon dioxide.

21. The superconducting structure of claim 18, wherein the intermediate material layer is between about 8 nm and about 20 nm thick.

22. The superconducting structure of claim 18, wherein the intermediate material layer is comprised of semiconductor material.

23. The superconducting structure of claim 22, wherein the semiconductor material is selected from the group consisting of gallium-arsenide, and silicon.

24. The superconducting structure of claim 1, wherein the second and third Josephson junctions are interface Josephson junctions.

25. The superconducting structure of claim 24, wherein the intermediate material layer is comprised of normal conducting material.

26. The superconducting structure of claim 25, wherein the normal conducting material is selected from the group consisting of gold, silver, platinum, and palladium.

27. The superconducting structure of claim 1, wherein the current traversing the coherent Josephson junction travels in the c-axis of the first and the second unconventional superconducting materials.

28. The superconducting structure of claim 1, wherein the first and second unconventional superconducting materials, the first Josephson junction, the second and third Josephson junctions, and the third superconducting material together form a loop.

29. The superconducting structure of claim 28, wherein the loop has a supercurrent with basis states that correspond to supercurrent flowing in opposite directions around the loop.

30. The superconducting structure of claim 1, wherein the third superconducting material is divided by a fourth Josephson junction.

31. The superconducting structure of claim 30, wherein the fourth Josephson junction includes an intermediate layer selected from the group consisting of insulating material, semiconducting material and superconducting material.

32. The superconducting structure of claim 30, wherein attached to either side of the fourth Josephson junction is an electrical lead.

33. The superconducting structure of claim 1, wherein a fourth superconducting material region comprising an electrode overlies a part of the third superconducting material and is separated from it by a layer of insulating material.

34. A qubit comprising at least one superconducting structure according to claim 1.

35. A qubit structure comprising: a first superconducting structure of claim 1, and a second superconducting structure of claim 1, wherein at least one of the first, second, or third superconducting materials of the first superconducting structure is connected to at least one of the first, second, or third superconducting materials of the second superconducting structure.

36. A quantum register comprising at least one qubit structure of claim 35.

37. A quantum computing method, comprising, in sequence:
cooling a structure that includes: a loop formed from a first and a second unconventional superconducting material, and a third superconducting material and a first Josephson junction between the first and second unconventional superconducting materials, and a second and third coherent Josephson junction between the first and second unconventional superconducting materials and the third superconducting material, wherein the cooling lowers the temperature of the structure sufficiently that the first and second unconventional superconducting materials, and the third superconducting material become superconducting, and thermal excitations are sufficiently suppressed to maintain coherence for a calculation;
establishing a quantum state of a supercurrent in the loop, wherein the quantum state is a superposition of a first state having a first current direction and a second state having a second current direction;
allowing the quantum state to evolve; and
measuring the supercurrent in the loop.

38. The method of claim 37, wherein the supercurrent in the loop is a ground-state current arising from a bistable nature of the first Josephson junction.

39. The method of claim 37, wherein establishing the quantum state comprises running a current through at least one of the first, second, or third superconducting materials in a preferred direction.

40. The method of claim 39, wherein running a current further comprises providing an asymmetric current in the loop.

41. The method of claim 37, wherein evolution of the quantum state includes isolating the loop.

42. The method of claim 37, wherein the structure further comprises an electrode overlying the third superconducting material, wherein the evolution of the state of the loop is affected by the voltage of the electrode.

43. The method of claim 37, wherein the structure further comprises a fourth Josephson junction in the third superconducting material that interrupts the loop.

44. The method of claim 43, wherein the structure further comprises leads on either side of the fourth Josephson junction.

45. The method of claim 44, wherein establishing an initial state includes applying a bias current through the leads for a time t, wherein a bias current in a first direction correlates with a first state, and a bias current in a second direction correlates with a second state.

46. The method of claim 45, wherein the time t is on the order of a reciprocal of the tunneling amplitude of the structure.

47. The method of claim 37, wherein measuring comprises:
grounding the loop;
biasing the loop; and
determining a direction of circulating supercurrent in the loop.

48. The method of claim 47, wherein determining the direction of circulating supercurrent in the loop includes measuring a potential across at least one of the first, second, or third superconducting materials.

49. The method of claim 47, wherein grounding the quantum state includes connecting at least on of the first, second, or third superconducting materials of the loop to a superconducting reservoir.

50. The method of claim 49, wherein a superconducting reservoir includes a thin film of superconducting material having constant phase.

51. The method of claim 47, wherein biasing the loop includes current-biasing at least one of the first, second, or third superconducting materials of the loop.

52. The method of claim 51, wherein the magnitude of the bias current is less than about 100 nA.

53. A quantum computing method, comprising:
cooling a qubit structure that includes a plurality of superconducting low-inductance qubits, and wherein the cooling lowers the temperature of the qubit structure sufficiently that the superconducting low-inductance qubits become superconducting, and thermal excitations are sufficiently suppressed to maintain coherence for a calculation;
establishing a quantum state of a supercurrent in each of said superconducting low-inductance qubits, wherein the quantum state is a superposition of a first state having a first current direction and a second state having a second current direction;
allowing the quantum state to evolve; and
measuring the supercurrent in each of said superconducting low-inductance qubits, wherein each of said superconducting low-inductance qubits comprises: a loop formed from a first uncoventional superconducting material, a second unconventional superconducting material, and a third superconducting material and a first Josephson junction between the first and second unconventional superconducting materials, and a second and third coherent Josephson junction between the first and second unconventional superconducting materials and the third superconducting material,
and wherein the qubit structure further comprises a mechanism for coupling at least two of the superconducting low-inductance qubits.

54. The method of claim 53, further comprising establishing a quantum state of a supercurrent in each of the plurality of superconducting low-inductance qubits in the structure, wherein each of the quantum states is a superposition of a first state having a supercurrent direction in a corresponding loop and a second state having a second supercurrent direction in the loop.

55. The method of claim 54, wherein the mechanism for coupling is used to entangle the quantum states of at least two of the plurality of superconducting low-inductance qubits.

56. The method of claim 55, wherein the mechanism for coupling includes providing a switch, wherein the conductivity of the switch is controlled to provide an open state and a closed state.

57. The method of claim 56, wherein the open state is used to entangle quantum states of at least two of the plurality of superconducting low-inductance qubits.

58. The method of claim 53, further comprising applying a single-qubit bias operation on the quantum state of the supercurrent in the loop, wherein applying a single-qubit bias operation includes current biasing at least one of the first unconventional superconducting material, the second unconventional superconducting material, and the third superconducting material of the loop.

59. The method of claim 58, wherein current biasing at least one of the first unconventional superconducting material, the second unconventional superconducting material, and the third superconducting material of the loop includes providing a current source for a time $t_b$.

60. The method of claim 59, wherein the time is correlated with the tunneling amplitude of the loop.

61. The method of claim 59, wherein the time is less than about 0.1 ns.

62. The method of claim 58, wherein the magnitude of the bias current is less than the critical current of the Josephson junctions that the bias current passes through.

63. The method of claim 62, wherein the magnitude of the bias current is less than about 10 nA.

64. A poly-crystal structure comprising:
a polycrystalline unconventional superconducting material, having at least three crystal regions, wherein a first of said at least three crystal regions is differentiated from a second of said at least three crystal regions by having a misoriented crystallographic alignment; and
at least one loop, wherein said loop connects to at least two regions of said at least three crystal regions of said polycrystal unconventional superconducting material, and wherein said at least one loop includes a conventional superconducting material.

65. The structure of claim 64, wherein a grain boundary Josephson junction is formed between each of said at least three crystal regions.

66. The structure of claim 64, wherein each of said at least one loop includes Josephson junctions at each interface with said at least three crystal regions.

67. The structure of claim 66, wherein each of said at least one loop includes three Josephson junctions.

68. The structure of claim 67, wherein each of said at least one loop further includes a fourth Josephson junction and a pair of leads.

69. A superconducting structure comprising:
a first unconventional superconducting material;
a second unconventional superconducting material;
a means for coupling the first and second unconventional superconducting materials;
a third superconducting material that overlies a part of the first and a part of the second unconventional superconducting materials;
a means for coherently coupling the third superconducting material to the first unconventional superconducting material;
a means for coherently coupling the third superconducting material to the second unconventional superconducting material; and
an insulating material separating the first and second unconventional superconducting materials from the third superconducting material, wherein flux can be stored.

70. The superconducting structure of claim 69, wherein the first and second unconventional superconducting materials comprise a material that violates time reversal symmetry.

71. A quantum computing apparatus, comprising:
a qubit structure that includes a plurality of superconducting low-inductance qubits, that is cooled to a sufficiently low temperature that the superconducting low-inductance qubits become superconducting, and thermal excitations are sufficiently suppressed to maintain coherence for a calculation;
means for establishing a quantum state of a supercurrent in each of said superconducting low-inductance qubits, wherein the quantum state is a superposition of a first state having a first current direction and a second state having a second current direction;
means for allowing the quantum state to evolve; and
means for measuring the supercurrent in each of said superconducting low-inductance qubits, wherein each of said superconducting low-inductance qubits comprises: a loop formed from a first and a second unconventional superconducting material, and a third superconducting material and a first Josephson junction between the first and second unconventional superconducting materials, and a second and third coherent Josephson junction between the first and second unconventional superconducting materials and the third superconducting material, and wherein the qubit structure further comprises a means for coupling at least two of the superconducting low-inductance qubits.

72. The quantum computing apparatus of claim 70, wherein the first and second unconventional superconducting materials comprise a material that violates time reversal symmetry.

* * * * *

UNITED STATES PATENT AND TRADEMARK OFFICE
CERTIFICATE OF CORRECTION

PATENT NO. : 6,979,836 B2  Page 1 of 1
DATED : December 27, 2005
INVENTOR(S) : Zagoskin et al.

It is certified that error appears in the above-identified patent and that said Letters Patent is hereby corrected as shown below:

Column 24,
Line 45, replace "Disorientation" with -- misorientation --.

Signed and Sealed this

Twenty-first Day of March, 2006

JON W. DUDAS
*Director of the United States Patent and Trademark Office*